(12) United States Patent
Sarkar et al.

(10) Patent No.: US 9,679,890 B2
(45) Date of Patent: Jun. 13, 2017

(54) JUNCTION-LESS INSULATED GATE CURRENT LIMITER DEVICE

(71) Applicant: Fairchild Semiconductor Corporation, San Jose, CA (US)

(72) Inventors: Tirthajyoti Sarkar, Pune (IN); Adrian Mikolajczak, Los Altos, CA (US); Ihsiu Ho, Salt Lake City, UT (US); Ashok Challa, San Jose, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 134 days.

(21) Appl. No.: 14/454,435

(22) Filed: Aug. 7, 2014

(65) Prior Publication Data

US 2015/0043114 A1 Feb. 12, 2015

Related U.S. Application Data

(60) Provisional application No. 61/864,271, filed on Aug. 9, 2013, provisional application No. 61/949,053, filed on Mar. 6, 2014.

(51) Int. Cl.
*H02H 9/00* (2006.01)
*H01L 27/02* (2006.01)
(Continued)

(52) U.S. Cl.
CPC ........ *H01L 27/027* (2013.01); *H01L 27/0266* (2013.01); *H01L 27/0288* (2013.01);
(Continued)

(58) Field of Classification Search
CPC .................................................. H01L 27/027
(Continued)

(56) References Cited

U.S. PATENT DOCUMENTS 4,611,220 A 9/1986 MacIver
4,746,960 A 5/1988 Valeri et al.
(Continued)

FOREIGN PATENT DOCUMENTS

EP 2562896 A2 2/2013
WO 98/59420 A1 12/1998
WO 02/01644 A2 1/2002

OTHER PUBLICATIONS

Stiles, Jim, "The Depletion NMOS Transistor—The Depletion MOSFET", The University of Kansas, Nov. 14, 2004, 3 pages.
(Continued)

*Primary Examiner* — Stephen W Jackson
(74) *Attorney, Agent, or Firm* — Brake Hughes Bellermann LLP

(57) ABSTRACT

In one general aspect, an apparatus can include a semiconductor substrate, and a trench defined within the semiconductor substrate and having a depth aligned along a vertical axis, a length aligned along a longitudinal axis, and a width aligned along a horizontal axis. The apparatus includes a dielectric disposed within the trench, and an electrode disposed within the dielectric and insulated from the semiconductor substrate by the dielectric. The semiconductor substrate can have a portion aligned vertically and adjacent the trench, and the portion of the semiconductor substrate can have a conductivity type that is continuous along an entirety of the depth of the trench. The apparatus is biased to a normally-on state.

20 Claims, 16 Drawing Sheets

(51) Int. Cl.
| | |
|---|---|
| *H01L 29/40* | (2006.01) |
| *H01L 29/772* | (2006.01) |
| *H01L 29/8605* | (2006.01) |
| *H01L 29/861* | (2006.01) |
| *H01L 29/66* | (2006.01) |
| *H01L 29/16* | (2006.01) |
| *H01L 29/20* | (2006.01) |

(52) U.S. Cl.
CPC .......... *H01L 29/407* (2013.01); *H01L 29/408* (2013.01); *H01L 29/66166* (2013.01); *H01L 29/772* (2013.01); *H01L 29/861* (2013.01); *H01L 29/8605* (2013.01); *H01L 29/1608* (2013.01); *H01L 29/20* (2013.01); *H01L 29/6606* (2013.01)

(58) Field of Classification Search
USPC .......................................................... 361/56
See application file for complete search history.

(56) References Cited

U.S. PATENT DOCUMENTS

| | | | |
|---|---|---|---|
| 5,581,100 | A | 12/1996 | Ajit |
| 5,723,915 | A | 3/1998 | Maher et al. |
| 5,998,834 | A | 12/1999 | Williams et al. |
| 6,137,338 | A | 10/2000 | Marum et al. |
| 6,947,266 | B1 | 9/2005 | Billingsley et al. |
| 7,035,071 | B1 | 4/2006 | Tiew et al. |
| 7,164,185 | B1 | 1/2007 | Salman et al. |
| 7,723,800 | B2 * | 5/2010 | Moens ................ H01L 29/0661 257/374 |
| 7,977,742 | B1 | 7/2011 | Disney |
| 8,115,273 | B2 * | 2/2012 | Moens .................. H01L 21/761 257/510 |
| 8,674,511 | B2 * | 3/2014 | Senoo ............... H01L 21/31654 257/678 |
| 9,350,175 | B2 | 5/2016 | Subramaniam et al. |
| 2002/0125931 | A1 | 9/2002 | Yue et al. |
| 2004/0085698 | A1 | 5/2004 | Ball et al. |
| 2004/0164355 | A1 | 8/2004 | Litwin et al. |
| 2005/0057867 | A1 | 3/2005 | Harris et al. |
| 2014/0266102 | A1 | 9/2014 | Mikolajczak |
| 2015/0021682 | A1 | 1/2015 | Yilmaz et al. |

OTHER PUBLICATIONS

Partial European Search Report for European Application No. 14000944.0, mailed Jul. 14, 2014, 7 pages.
Extended European Search Report Received for European Patent Application No. 14000944.0, mailed on Jan. 14, 2015, 12 pages.
Office Action for U.S. Appl. No. 14/855,033, mailed Aug. 17, 2016, 18 pages.

* cited by examiner

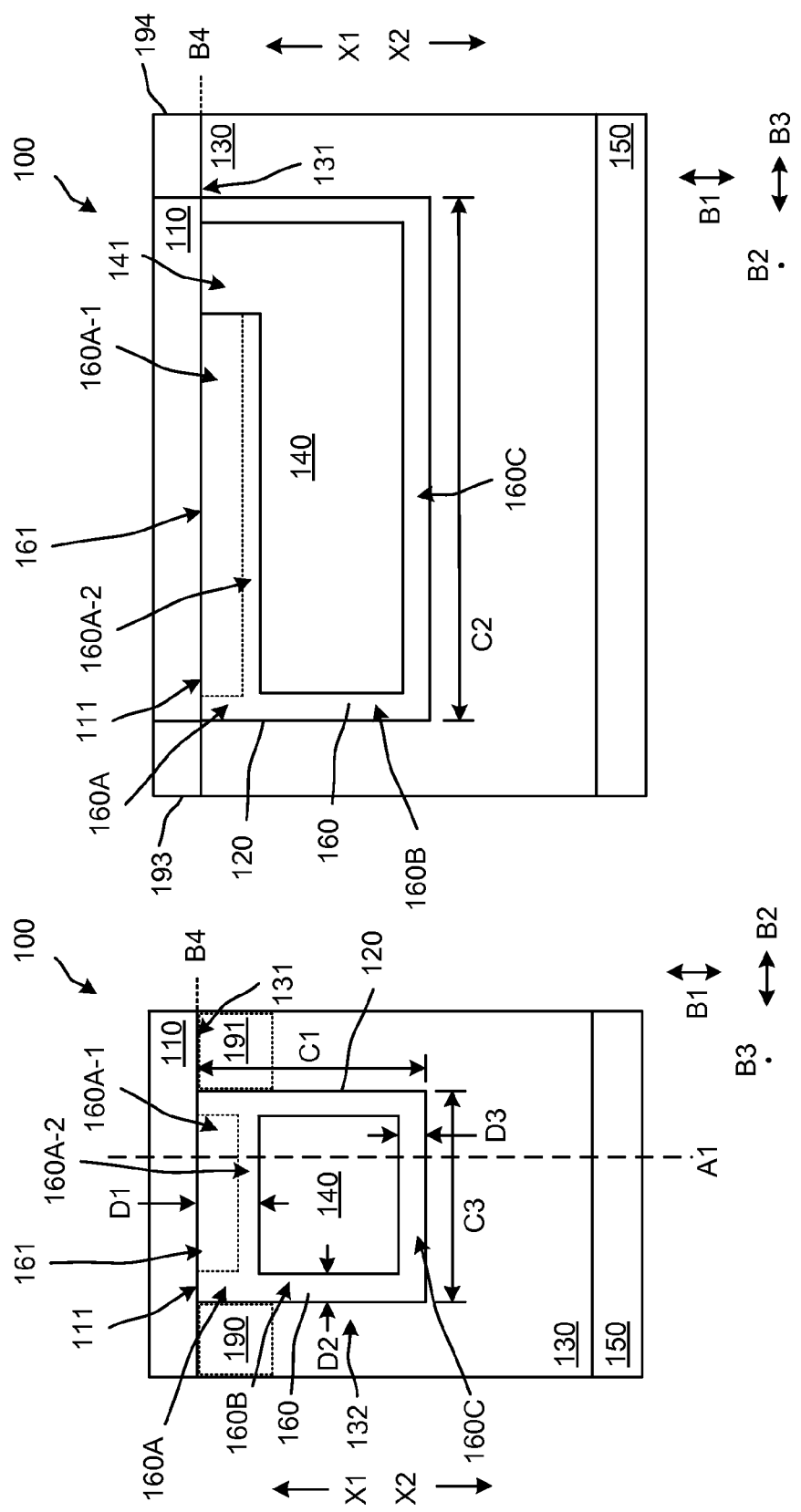

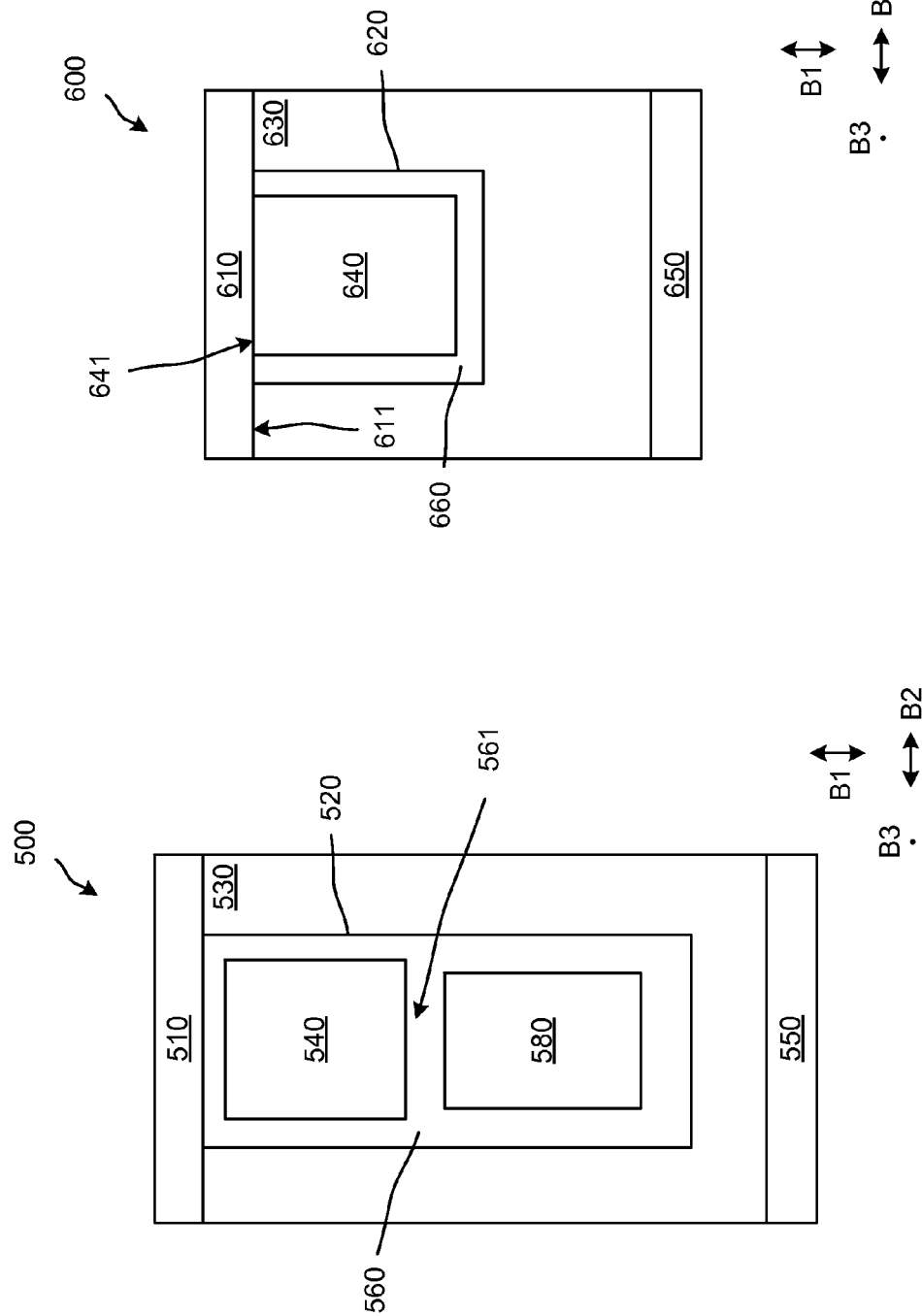

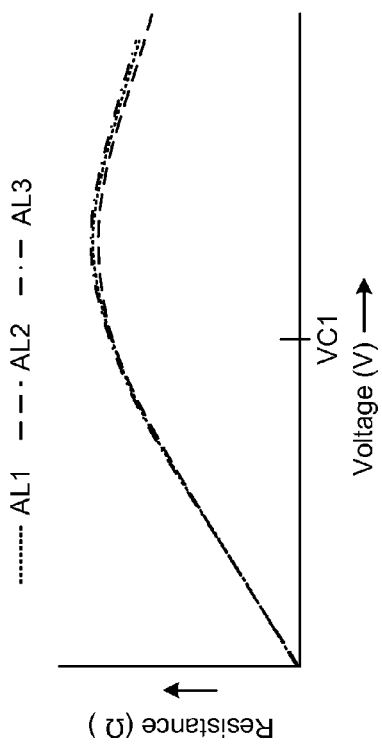
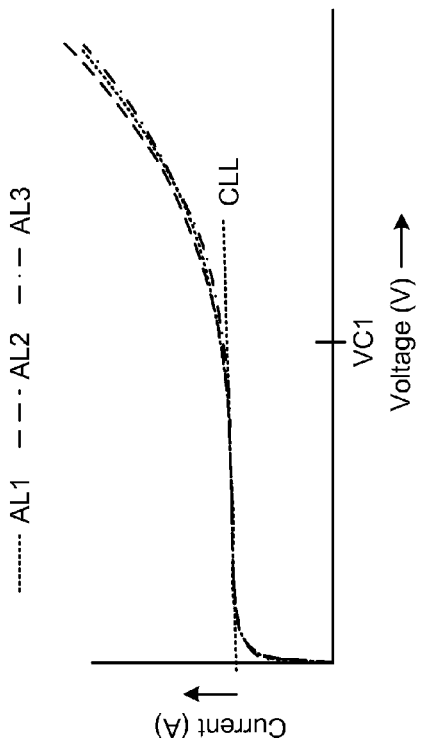
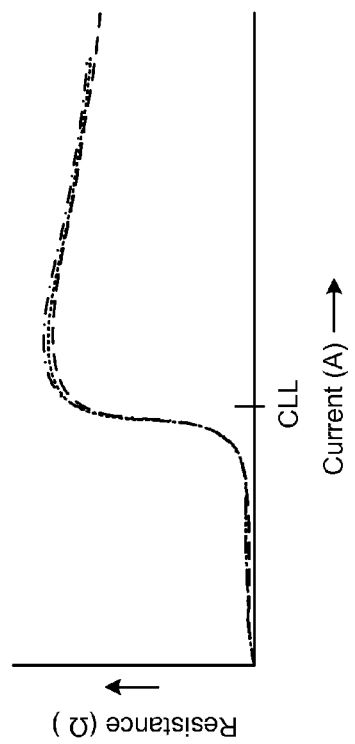
FIG. 12A
FIG. 12B
FIG. 12C

JUNCTION-LESS INSULATED GATE CURRENT LIMITER DEVICE

RELATED APPLICATIONS

This Application claims the benefit of and priority to U.S. Provisional Application No. 61/864,271, filed Aug. 9, 2013, and the benefit of and priority to U.S. Provisional Application No. 61/949,053, filed Mar. 6, 2014, both of which are incorporated herein by reference in their entireties.

This Application is also related to U.S. Non-provisional application Ser. No. 14/199,704, filed on Mar. 6, 2014, which claims priority to U.S. Provisional Application No. 61/787,123, filed on Mar. 15, 2013, both of which are incorporated herein by reference in their entireties.

TECHNICAL FIELD

This description relates to methods and apparatus including a current limiter.

BACKGROUND

An integrated circuit (e.g., a downstream integrated circuit) can be protected from undesirable power conditions (e.g., overvoltage conditions, overcurrent condition) using a protection device. The protection device, however, may not be configured to provide protection in response to each of the various types of undesirable power conditions that can occur such as a current in-rush upon activation, a current surge, and/or so forth. Accordingly, the protection device selected for power protection may not provide adequate protection of the integrated circuit or associated components in a desirable fashion. In addition, other components included in the integrated circuit may be increased in size to compensate for the inadequacies of the protection device in response to certain types of undesirable power conditions. Thus, a need exists for systems, methods, and apparatus to address the shortfalls of present technology and to provide other new and innovative features.

SUMMARY

In one general aspect, an apparatus can include a semiconductor substrate, and a trench defined within the semiconductor substrate and having a depth aligned along a vertical axis, a length aligned along a longitudinal axis, and a width aligned along a horizontal axis. The apparatus includes a dielectric disposed within the trench, and an electrode disposed within the dielectric and insulated from the semiconductor substrate by the dielectric. The semiconductor substrate can have a portion aligned vertically and adjacent the trench, and the portion of the semiconductor substrate can have a conductivity type that is continuous along an entirety of the depth of the trench. The apparatus being biased to a normally-on state.

The details of one or more implementations are set forth in the accompanying drawings and the description below. Other features will be apparent from the description and drawings, and from the claims.

BRIEF DESCRIPTION OF THE DRAWINGS

FIG. 1A is a cross-sectional view of a current limiter.
FIG. 1B is a cross-sectional view cut along FIG. 1A.
FIG. 5 illustrates another current limiter according to an implementation.
FIG. 6 illustrates yet another current limiter according to an implementation.
FIGS. 12A through 12C are diagrams that illustrate operation of multiple current limiters.

DETAILED DESCRIPTION

Figure 2A:
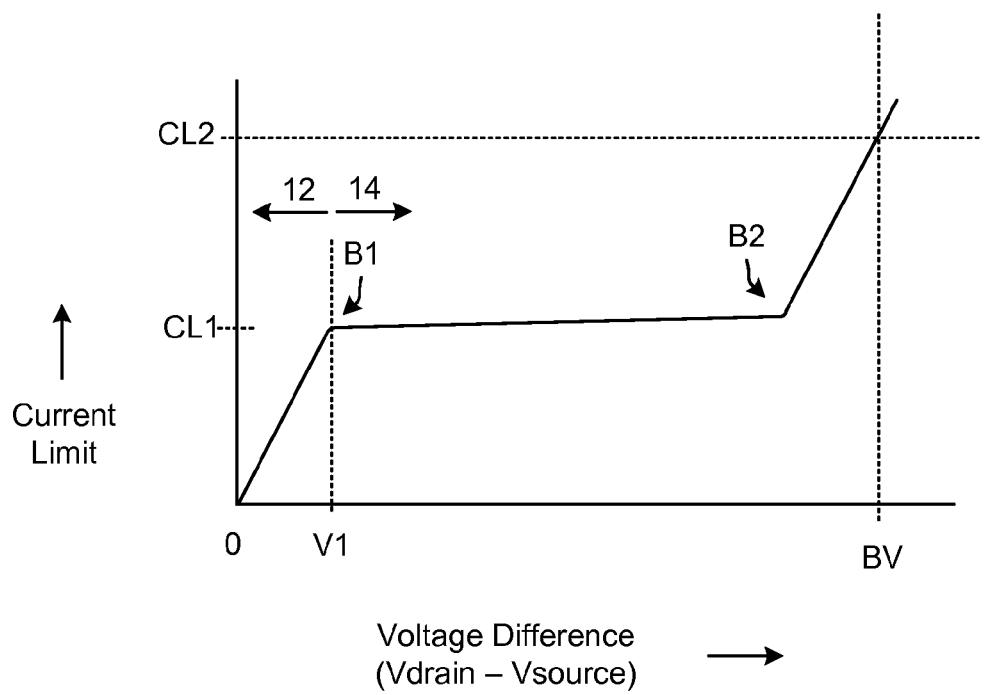
FIG. 2A illustrates a current through the current limiter shown in FIGS. 1A and 1B in response to a voltage difference.

FIG. 1A is a cross-sectional view of a current limiter 100. In some implementations, the current limiter 100 can be referred to as a junction-less current limiter. The current limiter 100 can be referred to as a junction-less current limiter, because the current limiter does not have, or does not include, a junction of two different conductivity type materials such as a PN junction including a P-type conductivity material and an N-type conductivity material. FIG. 1B is a cross-sectional view cut along line A1 of FIG. 1A. In some implementations, the primary conduction pathways from drain to source can be junction-less, saturating conduction pathways (which are described in more detail below).

The current limiter 100 is configured to provide power protection to a load (not shown) from one or more undesirable power conditions. In some embodiments, the undesirable power conditions (which can include an overvoltage condition and/or an overcurrent condition) such as a voltage spike (related to power supply noise) and/or a current spike (caused by a downstream overcurrent event such as a short) may be produced by power source (not shown). For example, the load may include electronic components (e.g., sensors, transistors, microprocessors, application-specific integrated circuits (ASICs), discrete components, circuit board) that could be damaged in an undesirable fashion by relatively fast increases in current and/or voltage produced by the power source. Accordingly, the current limiter 100 can be configured to detect and prevent these relatively fast increases in current and/or voltage from damaging the load and/or other components associated with the load (such as a circuit board).

As shown in FIG. 1A, the current limiter 100 has a trench 120 disposed in (e.g., defined within) a substrate 130 (also can be referred to as a semiconductor substrate). Although not labeled, the trench 120 has a sidewall (also can be referred to as a sidewall surface) and a bottom (also can be referred to as a bottom surface). The current limiter 100 shown in FIG. 1A can be referred to as having a vertical trench configuration.

The trench 120 includes an electrode 140 disposed therein and insulated from the substrate 130 by a dielectric 160. In some implementations, the electrode 140 can be referred to as a gate electrode. In some implementations, the dielectric 160 can be, for example, an oxide or another type of dielectric (e.g., a low-k dielectric). The electrode 140 can be a conductor that can include, for example, a material such as polysilicon.

As shown in FIG. 1A, the current limiter 100 includes a source conductor 110 disposed on a first side X1 (also can be referred to as side X1) of the substrate 130 and a drain conductor 150 disposed on a second side X2 (also can be referred to aside X2) of the substrate 130 opposite the first side of the substrate 130. The source conductor 110 and/or the drain conductor 150 can include a material such as a metal (e.g., multiple metal layers), polysilicon, and/or so forth. In contrast to many types of semiconductor devices, the drain conductor 150 can function as an input terminal and the source conductor 110 can function as an output terminal. Accordingly, the direction of typical current flow can be from the drain conductor 150 to the source conductor 110.

The source conductor 110, portions of the dielectric 160, a portion of the substrate 130, and the drain conductor 150 are stacked along the line A1 (along direction B1) (also can be referred to as a vertical direction). The source conductor 110, portions of the dielectric 160, the portion of the substrate 130, and the drain conductor 150 can be referred to as being included in a vertical stack.

Each of the source conductor 110, the substrate 130, the drain conductor 150, and so forth are aligned along a direction B2 (also can be referred to as a horizontal direction or as a lateral direction), which is substantially orthogonal to the direction B1. The direction B2 is aligned along or parallel to a plane B4, along which the source conductor 110, the substrate 130, the drain conductor 150, and so forth are also aligned. In FIG. 1A, a top surface 131 of the substrate 130 and a bottom surface 111 of the source conductor 110 are aligned along plane B4. In some implementations, a portion of the current limiter 100 proximate the source conductor 110, or a direction away from the drain conductor 150 (substantially along the direction B1), can be referred to as top portion or an upward direction. In some implementations, a portion of the current limiter 100 proximate the drain conductor 150, or a direction toward the drain conductor 150 (substantially along the direction B1), can be referred to as bottom portion or a downward direction.

A direction B3 into the page (shown as a dot) is aligned along or parallel to the plane B4 and is orthogonal to directions B1 and B2. In the implementations described herein, the vertical direction is normal to a plane along which the substrate 130 is aligned (e.g., the plane B4). The directions B1, B2, and B3, and plane B4, are used throughout the various views of the implementations described throughout the figures for simplicity. Each of the directions can also be referred to as an axis.

The trench 120 has a depth C1 aligned the direction B1 (or axis), a length C2 (shown in FIG. 1B) aligned along the direction B3 (also can be referred to as a longitudinal axis), and a width C3 aligned along the direction B2 (also can be referred to as a horizontal axis). The aspect ratio of the trench 120 is defined so that the length C2 is greater than the width C3 of the trench 120. Also, the trench 120 can generally be referred to as being aligned along the direction B1 or can be referred to as having a depth along the direction B1.

As mentioned above, the current limiter 100 is a junction-less device. Accordingly, the substrate 130 can have a portion (on a right side or left side (e.g., a space charge region 132) of the trench 120) aligned along direction B1 (e.g., vertically aligned along direction B 1) and adjacent the trench 120 that has a conductivity type that is continuous along an entirety of the depth C1 of the trench 120. In other words, the substrate 130 has a portion that is a single conductivity type along the entirety of the depth C1 of the trench 120. In some implementations, the portion of the substrate 130 can be a first portion of the substrate 130, and the drain conductor 150 can be separated from a portion of the dielectric 160 by a second portion of the substrate 130.

Because the current limiter 100 does not have a junction, the current limiting functionality of the current limiter 100 can have an increase/decrease in current limit (e.g., saturation current) and increase/decrease in resistance (e.g., on-resistance, off resistance) with changes in temperature resulting in a thermally self-balanced device (which can be a result of a positive temperature coefficient of resistance) that can better support parallel device implementations. This is contrasted with a device including a junction. More details related to parallel device implementations are described in connection with, for example, FIG. 4.

In some implementations, the space charge region 132 can be referred to as a region or substrate region. A space charge region on the right side of the trench 120 is not labeled in FIG. 1A.

The features of the current limiter 100 are mirrored. For example, the space charge region 132 on the left side of the current limiter 100 shown in FIG. 1A are mirrored on the right side of the current limiter 100. Although not shown in FIGS. 1A and 1B, the space charge region 132 can be disposed within, or can define, a mesa between the trench 120 and another trench (not shown) of the current limiter 100. Because the current limiter 100 is a junction-less device, the space charge region 132 (or mesa) excludes a body region (e.g., a P-type body region). Also, the current limiter 100 excludes source regions that may be included (e.g., adjacent to a trench), for example, in a vertical MOSFET device.

As shown in FIGS. 1A and 1B, the substrate 130 has a single conductivity type (e.g., an N-type conductivity, a P-type conductivity) that is continuous between the source conductor 110 and the drain conductor 150. In other words, the substrate 130 can have a continuous conductivity type between the source conductor 110 and the drain conductor 150. In some implementations, the substrate 130 can have a single conductivity type that is continuous, but varies along the direction B1. For example, the substrate 130 can include multiple epitaxial layers that have different doping concentrations, but are of the same conductivity type. As another example, the substrate 130 can have a doping concentration (e.g., a graded doping concentration) that decreases along direction B1, or decrease along direction B1.

As shown in FIG. 1A, a source region 190 can be included in the space charge region 132. Another source region 191 is included in a space charge region on a side of the trench 120 opposite the space charge region 132. In some implementations, the source region 190 can extend to a depth within the substrate 130 below a top surface of the electrode 140. The source region 190 can be doped such that a contact between the source conductor 110 and the source region 190 is ohmic.

Said differently, the space charge region 132 can have a single conductivity type that is continuous between the source conductor 110 and the drain conductor 150. The source conductor 110 is disposed on side X1 of the substrate 130 and the drain conductor 150 is disposed on side X2 of the substrate 130 opposite side X1 of the substrate 130. The portion of the substrate (which can include the space charge region 132) can have a conductivity type (e.g., single conductivity type) extending between the source conductor 110 and the drain conductor 150.

The current limiter 100 shown in FIGS. 1A and 1B is configured as a default "on" device (e.g., a biased on device, or always on device). In other words, the current limiter 100 is configured to be in an on-state without limiting current until a voltage difference is applied between the source conductor 110 and the drain conductor 150. Specifically, current can be permitted to flow between the source conductor 110 and the drain conductor 150 through, for example, the space charge region 132.

The current limiter 100 is configured to change from the on-state (e.g., normally-on state (e.g., biased on) or normally conducting without current limiting) to a resistive or current-limiting state in response to a difference between a potential (also can be referred to as a voltage) applied to the drain conductor 150 and a potential applied to the source conductor 110 is positive. As a specific example, the current limiter 100 is configured to limit a current through current limiter 100 when a potential applied to (or at) the drain conductor 150 is higher than a potential applied to (or at) the source conductor 110. In other words, the current limiter 100 is in a current-limiting state when a potential applied to (or at) the source conductor 110 is different than (e.g., less than) a potential applied to (or at) the drain conductor 150. In response to the difference in potential, an electrical field (which can be associated with one or more depletion regions) is formed in the space charge region 132 and the electrical field can limit current flowing through the space charge region 132. More details related to operation of the current limiter are described in connection with at least FIGS. 2A and 2B.

FIG. 2A illustrates a current (on the y-axis) through the current limiter 100 in response to a voltage difference (on the x-axis) between a potential applied to the drain conductor 150 (input terminal) (Vdrain) and a potential applied to the source conductor 110 (the output terminal) (e.g., voltage across a two-terminal device) (Vsource). In some implementations, the voltage difference can be referred to as a voltage buildup. As the voltage difference increases, the current limit of the current limiter 100 increases approximately linearly until approximately voltage difference V1. At approximately voltage difference V1, the current (or conducted current) through the current limiter 100 is limited to approximately a saturation current CL1 in at least the space charge region 132. Accordingly, the current limit of the current limiter 100 is approximately constant (or limited to an approximately constant current) even with a relatively large change in voltage difference between a potential applied to the source conductor 110 and a potential applied to the drain conductor 150. In some implementations, the current limiter 100 can be in a non-current limiting state and pass (or substantially pass) a current limit at approximately 0V, and can have a relatively low space charge region resistance (also can be referred to as a resistance or device resistance) until current limiting begins. The I-V curve before voltage difference V1 has a different slope than the I-V curve after the voltage difference V1.

The point of inflection between a linear region 12 (at voltage differences less than voltage difference V1) and a saturation region 14 (at voltage difference greater than voltage difference V1) can be referred to as a saturation point B1. The current limiter 100 may not be in a current-limiting state when in the linear region 12 and when in the saturation region 14. As shown in FIG. 2A, the current limiter 100 can function approximately as a resistor before the saturation point B1 with changes in the voltage difference (and when in the linear region 12). After the saturation point B1, the current limiter 100 no longer functions linearly with changes in the voltage difference (and when in the saturation region 14). The current limiter 100 can limit current as a resistor when functioning as a resistor, but can limit current more dramatically (in a non-linear fashion and no longer as a resistor) after the saturation point B1.

As shown in FIG. 2A, a breakdown of the current limiter 100 can occur at approximately point B2. In some implementations, the breakdown at approximately point B2 can be an avalanche type breakdown. In some implementations, the breakdown of the current limiter 100 can have a breakdown voltage at approximately breakdown voltage BV (and current CL2) of the current limiter 100. In some implementations, current CL2 can be 2 times (or more) of current CL1. The breakdown voltage can also be referred to as a breakdown voltage between source and drain (BVds).

Figure 2B:
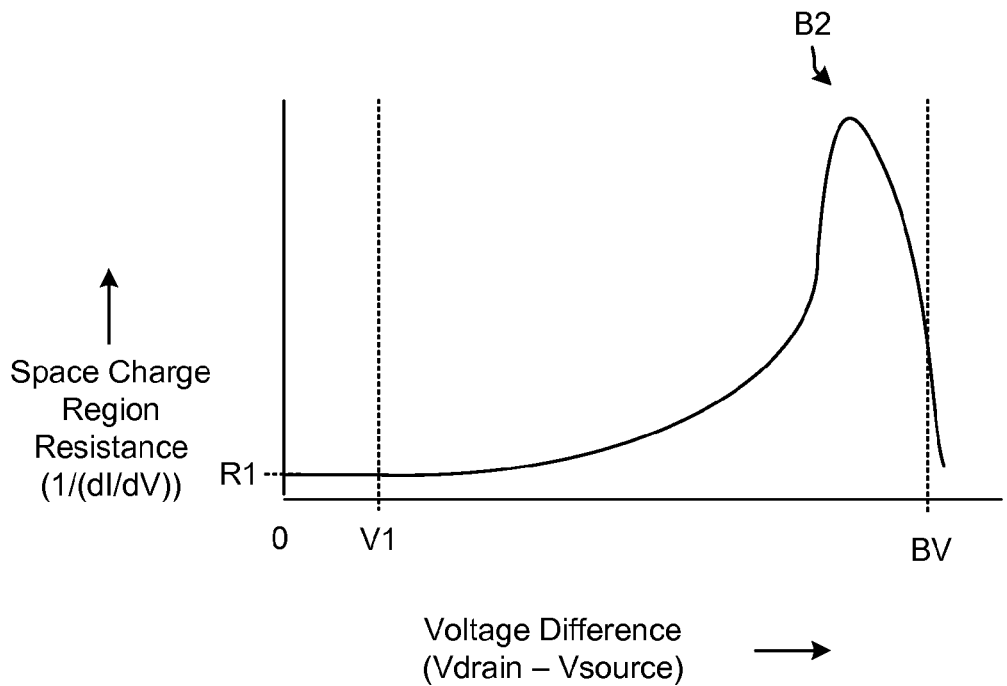
FIG. 2B illustrates a space charge region resistance of the current limiter shown in FIGS. 1A and 1B versus voltage difference.

FIG. 2B illustrates a space charge region resistance of the current limiter 100 (on the y-axis) versus voltage difference across the current limiter 100. The space charge resistance is represented mathematically as the reciprocal of the change in current over the change in voltage ($1/(dI/dV)$). The difference in voltage can be a difference between a potential applied to the drain conductor 150 and a potential applied to the source conductor 110 of the current limiter 100. As shown in FIG. 2B, the space charge region resistance of the current limiter 100 can be relatively small (e.g., approximately 1 ohm, less than 5 ohms) until the current limiter 100 reaches approximately the saturation point B1 shown in FIG. 2A. After the saturation point B1, the space charge region resistance of the current limiter 100 can increase significantly with relatively small changes (e.g., increases) in voltage through the current limiter 100.

Figure 2C:
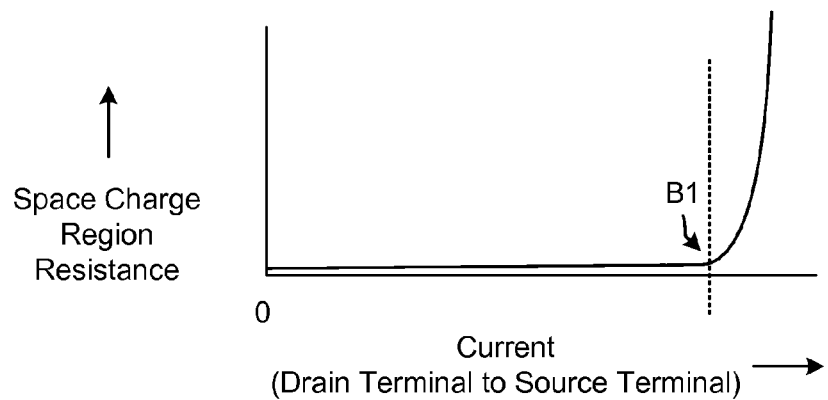
FIG. 2C illustrates a resistance of the current limiter versus current through the current limiter shown in FIGS. 1A and 1B.

FIG. 2C illustrates a space charge region resistance of the current limiter 100 versus current through the current limiter 100. In some implementations, the space charge region resistance of the current limiter 100 can increase more than 5 times (e.g., 10 times, 20 times) between a non-current-limiting state and a current-limiting state. In some implementations, the space charge region resistance of the current limiter 100 can vary by more than a decade between the non-current-limiting state and the current-limiting state. For example, when in a non-current-limiting state, the space charge region resistance of the current limiter 100 can be approximately between less than one ohm and a few ohms (e.g., 0.5 ohms, 1 ohm, 3 ohms). The space charge region resistance of the current limiter 100 when in a non-current-limiting state can be referred to as a baseline space charge region resistance. When in a current-limiting state, the space charge region resistance of the current limiter 100 can be much greater than a few ohms (e.g., 50 ohms, 100 ohms, 200 ohms). In some implementations, when in the current-limiting state and when in the saturation region, the space charge region resistance of (or across) the current limiter 100 can be more than 5 times the baseline space charge region resistance.

Because the electrical field of the current limiter 100 is based on a voltage difference, the current limiter 100 can limit current relatively fast (e.g., instantaneously) compared with other types of devices. The speed with which the current limiter 100 starts to limit current can be referred to as a response time. In some implementations, the response time can be less than 1 microsecond (e.g., 1 nanosecond (ns), less than 10 ns). For example, the current limiter 100 can be configured to limit current significantly faster than a thermally-based device can limit current in response to changes in temperature.

Also, because the current limiter 100 is configured to limit current in response to a voltage difference, the current limiter 100 can continue to respond to changes in voltage and limit current after the temperature of a system has increased to, for example, a relatively high temperature that would otherwise render a thermally-based device ineffective or inoperable. In other words, the current limiter 100 can have a substantially constant functionality in response to changes in temperature. Said differently, the current limiter 100 can operate independent of (or substantially independent of) changes in temperature. In some implementations, a saturation current of the current limiter 100 can be substantially constant with changes in temperature. In some implementations, a change in space charge region resistance of the current limiter 100 between the non-current-limiting state and current-limiting state can be greater than 5 times (e.g., greater than 10 times) with changes in temperature.

As shown in FIGS. 1A and 1B, the current limiter 100 is a two terminal (or two pin) device. Accordingly, the current limiter 100 can be a two terminal device without a ground terminal. The current limiter 100 has an input terminal at the drain conductor 150 and the current limiter 100 has an output terminal at the source conductor 110. In some implementations, the terminals can be described in terms of the devices coupled to the terminals. For example, if the current limiter 100 is configured to protect a motor, an output terminal of the current limiter 100 (which faces the motor) can be referred to as a motor terminal and an input terminal of the current limiter 100 (which faces a power source) can be referred to as the power terminal.

Referring back to FIGS. 1A and 1B, in some implementations, one or more portions of the dielectric 160 disposed around the electrode 140 can be referred to as gate dielectric portions. In some implementations, a portion 160A of the dielectric 160 can be referred to as a top dielectric portion, a portion 160B of the dielectric 160 on a side of the electrode 140 can be referred to as a sidewall dielectric portion or as a gate dielectric portion, and a portion 160C of the dielectric 160 can be referred to as a bottom dielectric portion. As shown in FIG. 1A, the space charge region 132 is in contact with the dielectric 160.

As shown in FIGS. 1A and 1B, the source conductor 110 is disposed on the top surface 131 of the substrate 130 and the dielectric portion 160A is disposed between the source conductor 110 and the electrode 140. Accordingly, the source conductor 110 is also disposed on a top surface 161 of the dielectric portion 160A. As shown in FIG. 1B, the source conductor 110 can be electrically isolated from one or more other structures (not shown) via one or more insulators 192, 193 (e.g., oxides, dielectrics).

In this embodiment, the electrode 140 is coupled to (e.g., physically coupled to, electrically coupled to) the source conductor 110 via an extension 141 shown in FIG. 1B. Accordingly, the electrode 140 is shorted to the source conductor 110. The extension 141 extends through the dielectric 160 so that only a portion of the source conductor 110 is insulated from the electrode 140 by dielectric portion 160A. The portion of the electrode 140 that is insulated from the source conductor 110 by the dielectric portion 160A can be referred to as being recessed within the trench 120.

The extension 141 in this embodiment is disposed at an end of the electrode 140 and at an end of the trench 120. In some implementations, the extension 141 can be located a different lateral location (e.g., a middle portion) along the trench 120 and/or the electrode 140.

In some implementations, the electrode 140 disposed within the trench 120 can be coupled to other electrodes in parallel trenches (aligned along direction B3) via one or more conductors disposed in one or more perpendicular trenches aligned along direction B2. In other words, several parallel trenches (including trench 120), which are aligned along a first direction (e.g., direction B3), can include electrodes (e.g., electrode 140) that are shorted by a conductor (e.g., an electrode) disposed in perpendicular trench orthogonally aligned along a second direction (e.g., direction B2) relative to the parallel trenches.

Although not shown in FIGS. 1A and 1B, the electrode 140 can be entirely insulated from (e.g., electrically insulated from) the source conductor 110. In such embodiments, the electrode 140 and the source conductor 110 may not be coupled via an extension. In such embodiments, the electrode 140 and the source conductor 110 may be entirely insulated by dielectric portion 160A so that the dielectric portion 160A is disposed between an entire top surface of the electrode 140 and an entire bottom surface of the source conductor 110. In such implementations, the electrode 140 can have a top surface that is entirely recessed within the trench 120 so that the top surface of the electrode 140 is at a depth (e.g., a vertical depth) below the top surface 131 of the substrate (or mesa).

In some implementations, the source conductor 110 can be directly coupled to the electrode 140 without an extension. In such implementations, the source conductor 110 can be directly disposed on the electrode 140. In such implementations, the source conductor 110 can be coupled to the electrode 140 without portions of a dielectric disposed therebetween. In such implementations, portions of the electrode 140 may not be recessed within the trench 120. Such an implementation is described in connection with, for example, FIG. 6.

In this implementation, the dielectric portion 160A has a first dielectric layer 160A-1 and a second dielectric layer 160A-2. Each of the dielectric layers of the dielectric portion 160A can also be referred to as dielectric portions. Accordingly, the first dielectric layer 160A-1 of the dielectric portion 160A can be referred to as dielectric portion 160A-1, and the second dielectric layer 160A-2 of the dielectric portion 160A can be referred to as dielectric portion 160A-2. The dielectric portion 160A has a portion (e.g., a top surface 161) coupled to the source conductor 110 (e.g., a bottom surface 111 of the source conductor 110) and a portion (e.g., a bottom surface (not labeled)) coupled to the electrode 140 (e.g., a top surface (not labeled) of the electrode 140). In some implementations, the dielectric portion 160A may not include different dielectric portions 160A-1, 160A-2, but may be, or may include, for example, a single dielectric.

As shown in FIG. 1B, the dielectric portion 160A has a thickness D1 that is greater than a thickness D2 of the dielectric portion 160B and/or greater than a thickness D3 of the dielectric portion 160C. In some implementations, a ratio of the thickness D1 to the thickness D2 can be 1:1 or greater than 1:1 (e.g., 2:1, 3:1). In some implementations, a ratio of the thickness D1 to the thickness D2 can be less than 1:1 (e.g., 1:2, 1:3). In some implementations, a ratio of the thickness D1 to the thickness D3 can be 1:1 or greater than 1:1 (e.g., 2:1, 3:1). In some implementations, a ratio of the thickness D1 to the thickness D3 can be less than 1:1 (e.g., 1:2, 1:3). The thickness of D3 can be relatively large (compared with thickness D1 and/or thickness D2 to modify a saturation creep voltage. More details related to saturation creep voltage are described in connection with at least FIG. 12C.

The thickness D2 of the dielectric portion 160B can have an effect on the saturation current (e.g., saturation current limit) and/or saturation voltage of the current limiter 100. For example, if the thickness D2 (e.g., sidewall dielectric) of the dielectric portion 160B is increased, the saturation current and/or saturation voltage can be increased. As another example, if the thickness D2 of the dielectric portion 160B is decreased, the saturation current and/or saturation voltage can be decreased.

In some implementations, the thickness D2 of the dielectric portion 160B can be used to control a depletion width within the space charge region 132. For example, a relatively large thickness D2 of dielectric portion 160B (compared with thickness D3 and/or a thickness of dielectric portion 160A-2) can result in a lower depletion width (e.g., lateral depletion width along direction B2) within the space charge region 132 at a voltage difference between the source conductor 110 and the drain conductor 150 than would be possible with a relatively small thickness D2 of dielectric portion 160B. In some implementations, a relatively large thickness D2 of dielectric portion 160B and a relatively large thickness D3 of dielectric portion 160C (compared with the thickness of dielectric portion 160A-2) can result in a lower depletion width (e.g., lateral depletion width along direction B2) within the space charge region 132 at a voltage difference between the source conductor 110 and the drain conductor 150 than would be possible with a relatively small thickness D2 of dielectric portion 160B and a relatively small thickness D3 of dielectric portion 160C. In some implementations, the thickness D2 of dielectric portion 160B and/or the thickness D3 of dielectric portion 160C can be used to simultaneously control the saturation current limit (e.g., saturation current CL1 shown in FIG. 2A, saturation current limit creep) versus on-resistance at a variety of voltages of the current limiter 100.

As shown in FIGS. 1A and 1B, the dielectric portion 160A can include a combination of materials in dielectric portion 160A-1 and 160A-2. In some implementations, the dielectric portion 160A may not include different dielectric portions 160A-1, 160A-2, but may be, or may include, for example, a single dielectric. In some implementations, the dielectric portion 160A-1 and the dielectric portion 160A-2 can be made of the same material or of different materials. For example, the dielectric portion 160A-1 can be (or can include) a first dielectric material and the dielectric portion 160A-2 can be (or can include) a second dielectric material. In some implementations, the dielectric portion 160A-1 can be a thermally grown oxide and the dielectric portion 160A-2 can be a deposited oxide. In some implementations, the dielectric portion 160A-1 and/or the dielectric portion 160A-2 can be doped with Boron and/or Phosphorus. The doping with Boron and/or Phosphorus can facilitate processing of the material during formation of the current limiter 100.

In this current limiter 100 the conductivity type of the substrate 130 (and space charge region 132) can have, for example, a conductivity type and the electrode 140 can have the same conductivity type. In this current limiter 100 the conductivity type of the substrate 130 (and space charge region 132) can have, for example, a first conductivity type and the electrode 140 can have the second conductivity type opposite the first conductivity type. For example, the substrate 130 (and space charge region 132) can have a P-type conductivity and the electrode 140 can have an N-type conductivity.

In some implementations, the lateral field effect or electrical field defined within the space charge region 132 can be defined by the work function of the electrode 140. In some implementations, the work function of the electrode 140 can be defined by a material of the electrode 140 and/or a doping level (e.g., dopant concentration) of a dopant included in the electrode 140. In some implementations, the electrode 140 can be a polysilicon material doped with, for example, Boron or Phosphorus.

In some implementations, the electrode 140 can have a P-type conductivity. The electrode 140 can have a P-type conductivity (and work function) that facilitates or enables normally-on operation (e.g., normally-on operation as described in connection with FIGS. 2A through 2C). In some implementations, a doping level of a dopant included in the electrode 140 can have a doping level or concentration to define the saturation current (e.g., current limit) of the current limiter 100 at a specific value.

In contrast with the current limiter 100 described herein, N-type dopant of an electrode in a MOSFET device can be critical to enable a desirable threshold voltage and to minimize gate resistance and gate capacitance. Although N-type dopant of the electrode 140 of the current limiter 100 may minimize gate resistance and gate capacitance, P-type dopant in the electrode 140 can enable normally-on operation in a desirable fashion. Specifically, a suitable level of P-type dopant in the electrode 140 can enable a relatively wide range of saturation current (e.g., current limit) control without changing (e.g., keeping relatively constant) other current limiter 100 device design parameters.

Below is an example table (Table I) that illustrates various electrode types, mesa doping concentrations (e.g., space charge region doping concentrations), and electrode work functions that can result in operation of a current limiter (e.g., current limiter 100) as a default normally-on device. As shown in Table I below, a P-type electrode may be necessary to enable normally-on operation with a relatively high mesa doping concentration.

TABLE I

| Electrode Type | Electrode Work Function | Mesa Doping Concentration | Default Device State |
|---|---|---|---|
| N-Type | ~4.4 eV | Low to High (~$10^{14}$ to ~$10^{18}$) | Normally-ON |
| P-Type | ~5.5 eV | High (~$10^{17}$ to ~$10^{18}$) | Normally-ON |
| Undoped | ~4.9 eV | Medium to High (~$10^{15}$ to ~$10^{18}$) | Normally-ON |

The thickness D1 of the dielectric portion 160A (which is a combination of dielectric portion 160A-1 and dielectric portion 160A-2) can be relatively large to prevent breakdown across the dielectric portion 160A. Specifically, the thickness D1 of the dielectric portion 160A can be relatively large to prevent breakdown across the dielectric portion 160A, in particular, when the source conductor 110 is not shorted to the electrode 140 (not shown in FIG. 1B). In some implementations, the dielectric portion 160A-2 can be formed first during processing and the dielectric portion 160A-1 can be formed on the dielectric portion 160A-2 to obtain an overall thickness D1 of dielectric portion 160A.

In some implementations, the dielectric 160 (and portions thereof such as dielectric portion 160A, 160B, and 160C) can be implemented to allow for reverse current operation without undesirable breakdown. An ACCUFET device, for example, in contrast with the current limiter 100, is normally-off when gate to source voltage is equal to zero. Thus, a reverse current in an ACCUFET device (which would require a high gate voltage is impossible to achieve in many scenarios and/or impractical in operation within applications.

The current limiter 100 can have a variety of characteristics and specification. For example, the current limiter 100 can have voltage limiting capability is greater than 100 V (e.g., 200 V, 350 V, 500 V). In some implementations, the current limiter 100 can have an operating series resistance less than 1 ohm ($\Omega$) (e.g., 500 m$\Omega$, 200 m$\Omega$). In some implementations, the current limiter 100 can have a surge response resistance greater than 20$\Omega$ (e.g., 30$\Omega$, 50$\Omega$, 100$\Omega$). In some implementations, the current limiter 100 can be configured to limit to several amperes at a voltage of more than a 100 V (e.g., limit to 1 A at 300 V, limit to 5 A at 220 V, limit to 3 A at 100 V). In some implementations, the response time (e.g., response time to current surges, response time to change from a conducting state to a current-limiting state) can be less than 1 microsecond (e.g., 1 ns, less than 10 ns). In some implementations, the current limiter 100 can be packaged for surface mounting or can be packaged with leads.

The current limiter 100 can have a relatively fast response time. For example, the current limiter 100 can have a response time less than 100 ns. The response time can be a time to change from a non-current-limiting state to a current-limiting state. Because the current limiter 100 can have a relatively fast response time, the current limiter 100 can be used in a variety of applications.

In some implementations, the substrate 130 can be a semiconductor region that include one or more epitaxial layers stacked on (e.g., grown on) a substrate. In some implementations, the substrate and/or epitaxial layer(s) can include, but may not limited to, for example, Silicon (Si), Galium Arsenide (GaAs), Silicon Carbide (SiC), and/or so forth. In some implementations, the substrate 130 can have a doping that varies along direction B1 (e.g., a relatively low dopant concentration in the mesa region and a relatively high dopant concentration in a region below the trench 120).

Although not shown in FIGS. 1A and 1B, the current limiter 100 can include multiple trenches. In other words, the structures illustrated in FIGS. 1A and 1B can be duplicated (e.g., repeated) within the substrate 130. Specifically, the trench 120, and features related thereto, can be duplicated within the substrate 130.

Although not shown in FIGS. 1A and 1B, the current limiter 100 can be integrated (e.g., monolithically integrated) with other types of devices such as vertical MOSFET devices (not shown). In such implementations, the current limiter 100 can be electrically isolated from other such semiconductor devices using, for example, a junction isolation, a trench isolation, an implant isolation, and/or so forth.

Figure 3A:
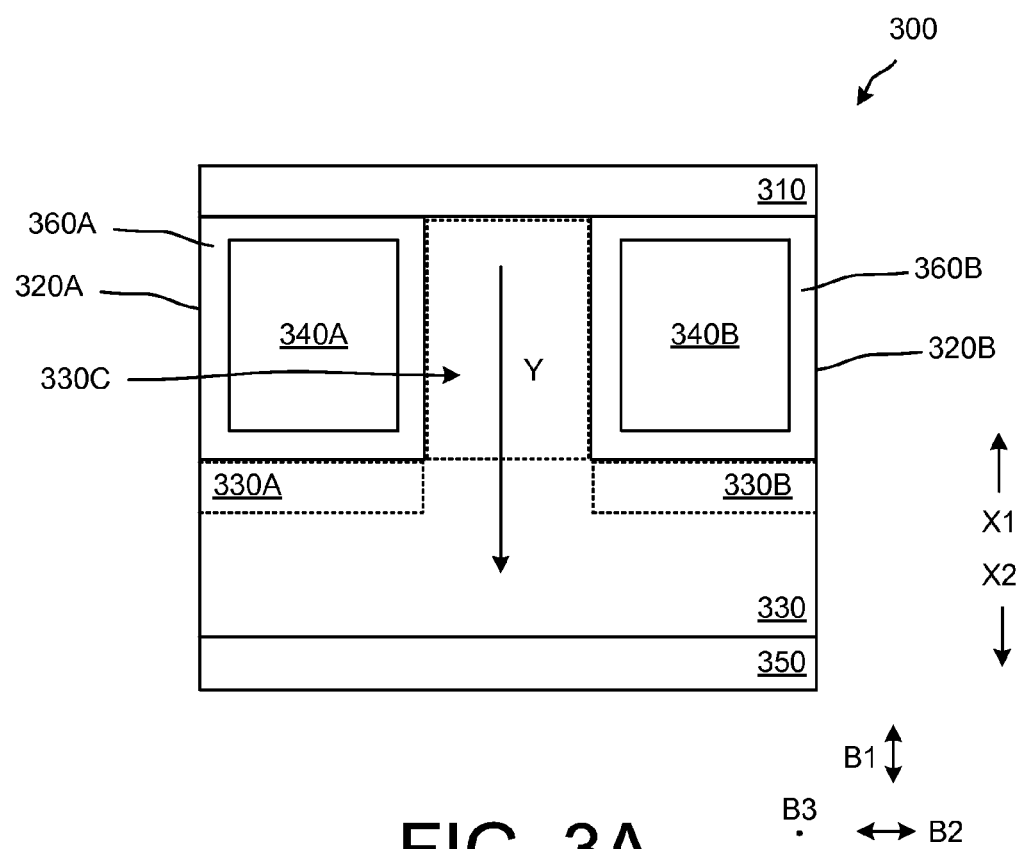
FIGS. 3A and 3B are diagrams that illustrate another current limiter according to an implementation.
Figure 3B:
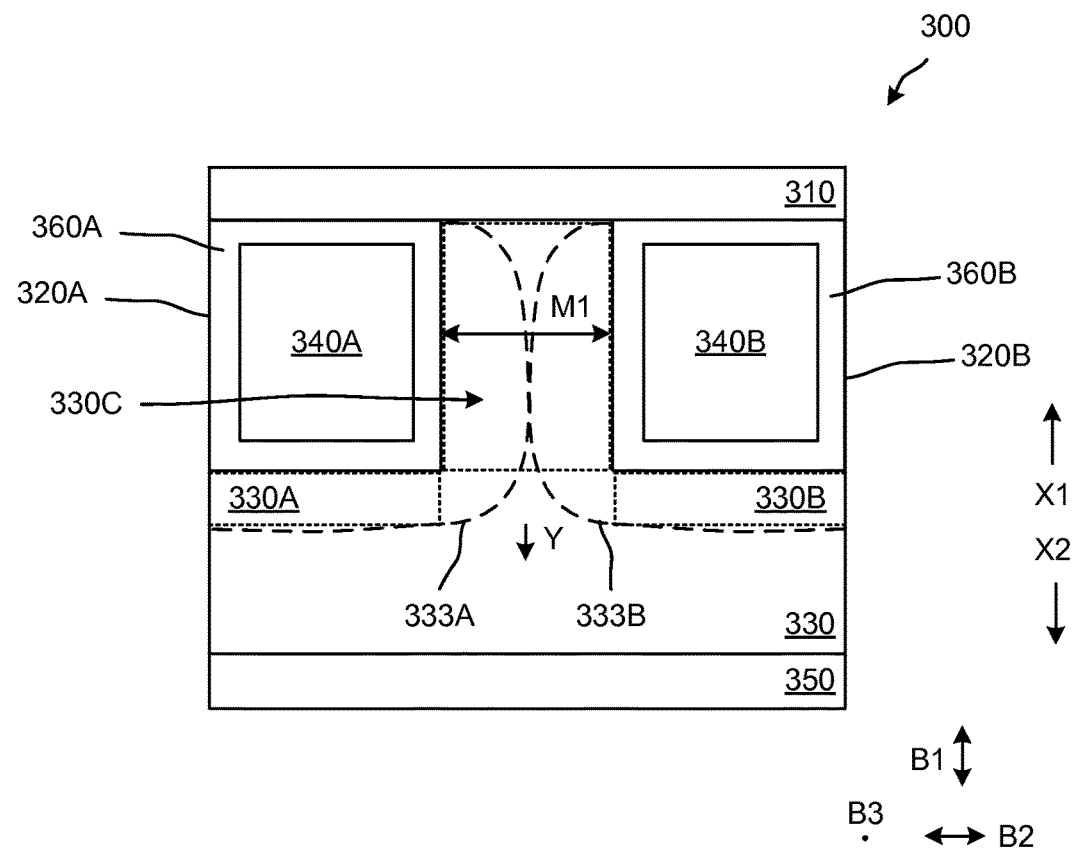

FIGS. 3A and 3B are diagrams that illustrate another current limiter 300 according to an implementation. FIG. 3A illustrates the current limiter 300 when in a non-current limiting state or conducting state, and FIG. 3B illustrates the current limiter 300 when in a current limiting state or resistive state.

FIGS. 3A and 3B illustrate portions of a space charge region including space charge region portion 330A, space charge region portion 330B, and space charge region 330C. Space charge region 330C is disposed between trench 320A and trench 320B. In other words, the space charge region 330C is disposed within a mesa (not labeled) between trench 320A and trench 320B. Space charge region 330A is disposed below (e.g., vertically below) trench 320A and is disposed between trench 320A and drain conductor 350, and space charge region 330B is disposed below (e.g., vertically below trench 320B and is disposed between trench 320B and drain conductor 350.

The space charge region portion 330A, the space charge region portion 330B, and the space charge region 330C are illustrated with rectangular dashed lines for simplicity. In some implementations, one or more of the space charge region portion 330A, the space charge region portion 330B, and the space charge region 330C can have different dimensions and/or shapes.

Electrode 340A is disposed within trench 320A and insulated by dielectric 360B, and electrode 340B is disposed within trench 320B and insulated by dielectric 360B. The current limiter 300 has a source conductor 310 and a drain conductor 350. The trenches 320A, 320B are formed within a substrate 330.

The characteristics and operation of the current limiter 300 can be similar to, or the same as, the operation of the current limiter 100 described in connection with, for example, FIGS. 1A through 2C. Accordingly, the operation and details of many of the features of the current limiter 300 such as dielectric features, gate to source connection features, and/or so forth will not be described in connection with FIGS. 3A and 3B.

Referring specifically to FIG. 3A, a current Y is permitted to flow between the source conductor 310 and the drain conductor 350 through the space charge region portion 330C when a voltage drop between the source conductor 310 and the drain conductor 350 is approximately 0. In such implementations, a potential (or voltage) applied to the drain conductor 350 can be less than a saturation potential or voltage.

As shown in FIG. 3B, the current Y is limited between the source conductor 310 and the drain conductor 350 through the space charge region 330C by depletion regions 333A and 333B (each illustrated with curved dashed lines) when a voltage drop between the source conductor 310 and the drain conductor 350 is greater than 0 (e.g., drain potential>source potential). In such implementations, a potential (or voltage) applied to the drain conductor 350 can be greater than a saturation potential or voltage and can be greater than a potential applied to the source conductor 310. In some implementations, the current Y is limited to a saturation current. In some implementations, the depletion region 333A can come in contact with or overlap with the depletion region 333B.

As shown in FIG. 3B, the depletion region 333A is formed in at least the space charge region portion 330C and in space charge region portion 330A below (e.g., vertically below) the trench 320A. Accordingly, the depletion region 333A is in contact with a portion of the dielectric 360A along a sidewall of the trench 320A and is in contact with a portion of the dielectric 360A along a bottom surface of the trench 320A. Similarly, the depletion region 333B is formed in the space charge region 330C and in the space charge region portion 330B below (e.g., vertically below) the trench 320B. Accordingly, the depletion region 333B is in contact with a portion of the dielectric 360B along a sidewall of the trench 320B and is in contact with a portion of the dielectric 360B along a bottom surface of the trench 320B.

In some implementations, the depletion region 333A and the depletion region 333B can exist in FIG. 3A without a difference in voltage between the drain conductor 350 and the source conductor 310 (which can be electrically coupled to both the electrode 340A and the electrode 340B). This can be the case depending on the dopant (e.g., dopant type and/or dopant concentration) of the electrode 340A and/or the dopant (e.g., dopant type and/or dopant concentration) of the electrode 340B. For example, a relatively high P-type dopant in the electrode 340A can result in the depletion region 333A being present even without a difference in voltage between the drain conductor 350 and the source conductor 310. This can also result in a relative low saturation current of the current limiter 300 compared with a current limiter having a N-type dopant and/or a relatively low P-type dopant concentration. In some implementations, a normally-off current limiter 300 can be produced with a relatively narrow mesa region (e.g., less than 0.3 micron) and suitable work function for the electrode 340A.

In some implementations, the electrode 340A and/or the electrode 340B can be configured with a work function (e.g., an N-type material) so that the current limiter 300 is biased off (or normally off) (e.g., biased to a current-limiting state). The work function can be defined by a dopant type and/or dopant level of the electrode 340A and/or the electrode 340B. To be biased off (or to a current-limiting state with operation in a saturation region (e.g., saturation region 14 shown in FIG. 2A)), the depletion region 333A and the depletion region 333B can be in contact (or overlapping). Also, a distance M1 (e.g., lateral distance) between trench 320A and trench 320B can be defined (e.g., defined to be relatively narrow) in conjunction with the dopant type and/or dopant level so that the current limiter 300 is biased off (or to a current-limiting state). In some implementations, as the distance M1 increases, a saturation current (e.g., saturation current CL1 shown in FIG. 2A) can also increase.

Figure 4:
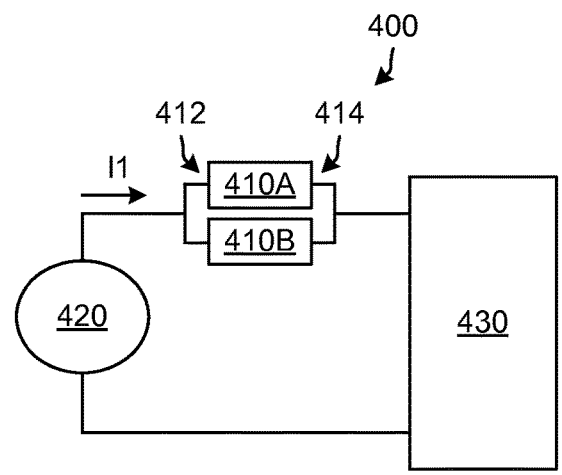
FIG. 4 is a diagram that illustrates two current limiters included in a circuit.

FIG. 4 is a diagram that illustrates two current limiters— current limiter 410A and current limiter 410B—included in a circuit 400. The current limiters 410A, 410B, are coupled in parallel within the circuit 400. The current limiters 410A, 410B are configured to limit a current I1 from a power source 420 to a load 430. As shown in FIG. 4, the current limiters 410A, 410B are each serially coupled between the power source 420 and the load 430. Although FIG. 4 illustrates an implementation including more than one current limiter, in some implementations, a circuit, such as circuit 400, can include just one current limiter.

The current limiters 410A, 410B can be used in parallel to increase the overall current limiting capability within the circuit 400 compared with using just one of the current limiters (e.g., current limiter 410A) alone. The current limiters 410A, 410B can be used in parallel to decrease overall resistance compared with using just one of the current limiters (e.g., current limiter 410A) alone.

Although illustrated in FIG. 4 as being serially coupled, in some implementations, one or more of the current limiters 410A, 410B can be coupled in parallel with the power source 420 and/or the load 430. In such implementations, the series resistance of one or more of the current limiters 410A, 410B can be eliminated. In some implementations, one or more of the current limiters 410A, 410B can function as a reverse voltage bypass device or as an overvoltage bypass device.

In this implementation, the current limiters 410A, 410B, which are normally-on devices, can have current limit that decreases (or resistance that increases) in response to an increase in temperature. The increase in temperature can result from self-heating when current is flowing through one or more of the current limiters 410A, 410B and the current limiters 410A, 410B are operating in a current-limiting mode. Accordingly, the parallel current limiters 410A, 410B can have self-balancing functionality. For example, if current through current limiter 410A is higher than a current through current limiter 410B, the current limit of current limiter 410A will decrease (or resistance will increase). This will result in current being redirected (e.g., dynamically redirected, transiently redirected) to current limiter 410B. Accordingly, current will be balanced (e.g., more balanced) between the current limiters 410A, 410B.

This type of self-balancing described above can be achieved with two or more current limiters in parallel and can result in one of the current limiters not drawing significantly more current than the remaining current limiters. Instead the current limiter drawing a relatively higher current will have a dynamically (e.g., transiently) adjusted current limit (in response to an increase in temperature due to self-heating from the higher current) that will result in current be re-directed to the remaining current limiters. The dynamic or transient heating characteristics of current limiters is described in more detail in connection with, for example, FIGS. 11A through 11C.

In some implementations, the load 430 can be an integrated circuit, a motor, and so forth. In some implementations, the load 430 can be included in a circuit of a power supply and the load 430 can be a portion of the power supply circuit. Specifically, one or more of the current limiters 410A, 410B can be included in a primary side (or high voltage side) of a power supply circuit and the load 430 can be a secondary side (or low voltage side) of a power supply circuit. The primary side and the secondary side can be separated by, for example, a transformer.

One or more of the current limiters 410A, 410B can be a device configured to limit a current using an electrical field such as the current limiters shown and described above or below in connection with, for example, FIGS. 1A-3B and FIGS. 5 through 9E. In some implementations, one or more of the current limiters 410A, 410B can be silicon-based device. Accordingly, the electrical field of one or more of the current limiters 410A, 410B can be produced within a silicon material (e.g., a silicon-based material). In some implementations, one or more of the current limiters 410A, 410B can be a resistive current filter device rather than an inductive current filter device.

The current limiters 410A, 410B can have a relatively low resistance when in a non-current-limiting state or mode (also can be referred to as a non-blocking state or mode). The current limiters 410A, 410B can be configured to permit a current to pass when in the non-current-limiting state. The current limiters 410A, 410B can have a relatively high resistance when in a current-limiting state or mode (also can be referred to as a blocking state or mode). The current limiters 410A, 410B can be configured to limit (or block) a current (or a portion thereof) when in the current-limiting state.

In some implementations, the power source 420 can be any type of power source such as, for example, a direct-current (DC) power source, an alternating-current (AC) power source, and/or so forth. In some embodiments, the power source 420 can include a power source that can be any type of power source such as, for example, a direct current (DC) power source such as a battery, a fuel cell, and/or so forth.

FIG. 5 illustrates another current limiter 500 according to an implementation. As shown in FIG. 5, the current limiter 500 includes an electrode 540 and a shield electrode 580 disposed within a trench 520. In some implementations, the electrode 540 can be referred to as a gate electrode. The electrode 540 and the shield electrode 580 are insulated from the substrate 530 by a dielectric 560. The shield electrode 580 can be insulated from the electrode 540 by an inter-electrode dielectric 561, which can be considered a portion of the dielectric 560. In some implementations, the inter-electrode dielectric 561 can be deposited separate (using a separate process) from dielectric 560. The current limiter 500 has a source conductor 510 and a drain conductor 550.

The characteristics and operation of the current limiter 500 can be similar to, or the same as, the operation of the current limiter 100 described in connection with, for example, FIGS. 1A through 2C. Accordingly, the operation and details of many of the features of the current limiter 500 such as dielectric features, gate to source connection features, and/or so forth will not be described in connection with FIG. 5.

In some implementations, the shield electrode 580 can be used to lower a resistance of the current limiter 500 (compared with a current limiter that does not include a shield electrode) during operation before the current limiter 500 reaches a saturation current. In some implementations, the shield electrode 580 is included in the current limiter 500 so that the current limiter 500 can be used in a relatively high voltage application having a relatively large breakdown voltage (e.g., breakdown voltage greater than 200V (e.g., 400V, 500V, 1000V)) without significantly increasing the resistance of the current limiter 500 during the linear portion of I-V characteristic (i.e., linear region 12 before reaching the current-limiting state in saturation region 14 FIG. 2A). Because the current limiter 500 is a biased on device (i.e., passes current or is in a conducting state until a difference in voltage results in changing to a current-limiting state), leakage that could be caused by the shield electrode 580 may not be undesirable as it could be in a typical MOSFET type device.

FIG. 6 illustrates yet another current limiter 600 according to an implementation. As shown in FIG. 6, the current limiter 600 includes an electrode 640 disposed within a trench 620. The electrode 640 is in contact with (e.g., is coupled to, is directly coupled to, electrically coupled to) a source conductor 610. Specifically, a top surface 641 of the electrode 640 is in contact with a bottom surface 611 of the source conductor 610. In some implementations, an entirety of the top surface 641 of the electrode 640 (along an entirely of direction B3) is coupled to the bottom surface 611 of the source conductor. In other words, if the electrode 640 is aligned along a longitudinal axis (along direction B3), the entirety of the top surface 641 of the electrode 640 along an entirety of the longitudinal axis can be coupled to the bottom surface 611 of the source conductor 610.

The characteristics and operation of the current limiter 600 can be similar to, or the same as, the operation of the current limiter 100 described in connection with, for example, FIGS. 1A through 2C. Accordingly, the operation and details of many of the features of the current limiter 600 such as dielectric features, gate to source connection features, and/or so forth will not be described in connection with FIG. 6.

As shown in FIG. 6, each sidewall (not labeled) of the electrode 640 and a bottom surface (not labeled) of the electrode 640 is insulated from a substrate 630 by a dielectric 660. The current limiter 600 shown in FIG. 6 also has a drain conductor 650.

Figure 7:
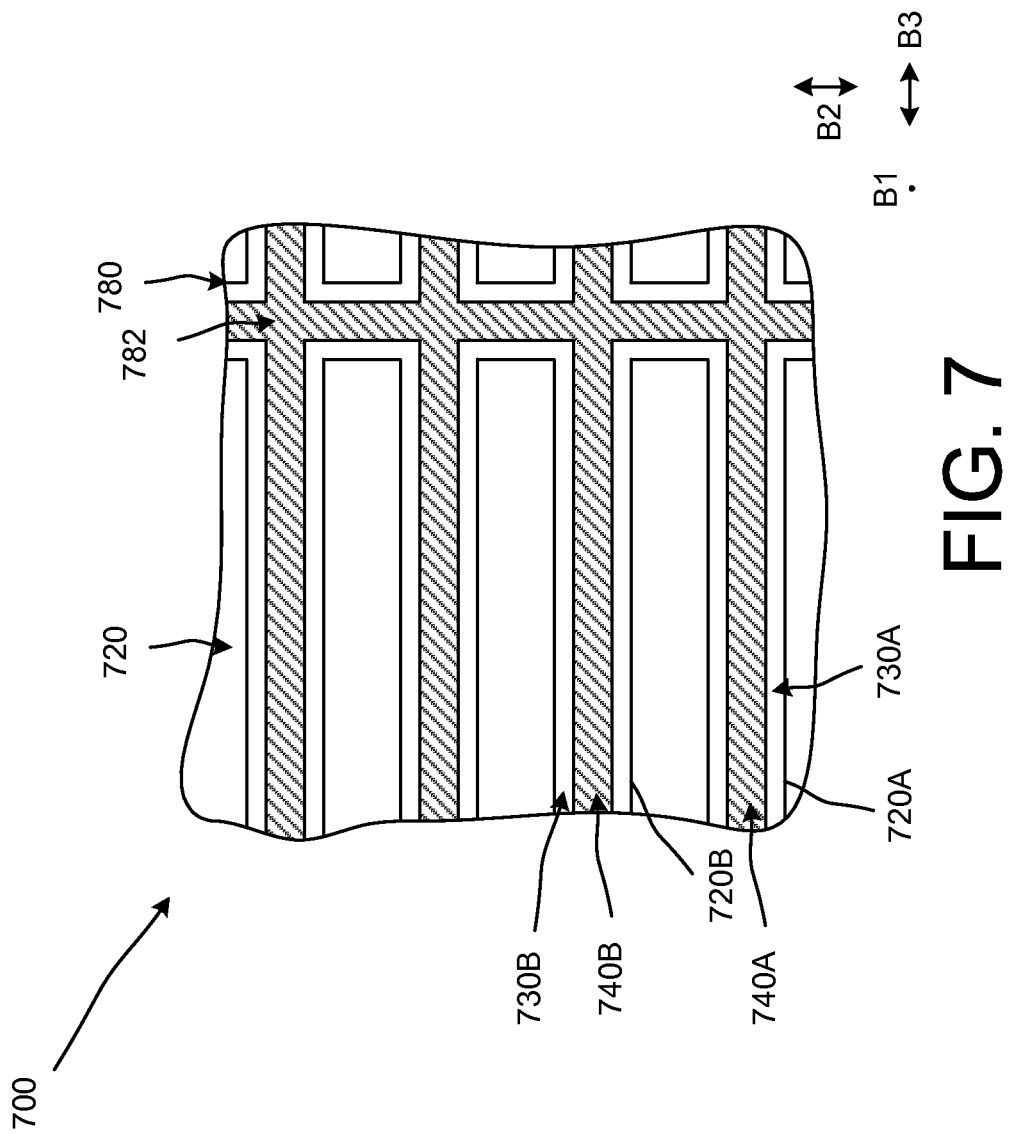
FIG. 7 is a diagram that illustrates another implementation of a current limiter.

FIG. 7 is a diagram that illustrates a plan view (or top view) another implementation of a current limiter 700. The current limiter 700 can have one or more of the features of the current limiters (e.g., current limiters 100, 300, 500, 600) shown and described in connection with FIGS. 1A through 6.

As shown in FIG. 7, the current limiter 700 includes parallel trenches 720 lined with dielectric 730 and including electrodes 740. For example, trench 720A is lined with dielectric 730A and includes an electrode 740A. The parallel trenches 720 are intersected by a transverse trench 780 including a conductor 782. The conductor 782 electrically connects the electrodes 740 of the parallel trenches 720. For example, the transverse trench 780 intersects (e.g., overlaps) trench 720A and trench 720B. The conductor 780 electrically couples electrode 740A and electrode 740B included in trenches 720A, 720B, respectively. In some implementations, the transverse trench 780 can be lined with a dielectric or may not include a dielectric. In some implementations, the transverse trench 780 can have a different depth (along direction B1) and/or different width (along direction B3) than a width (along direction B2) of one or more of the parallel trenches 720.

Figure 8:
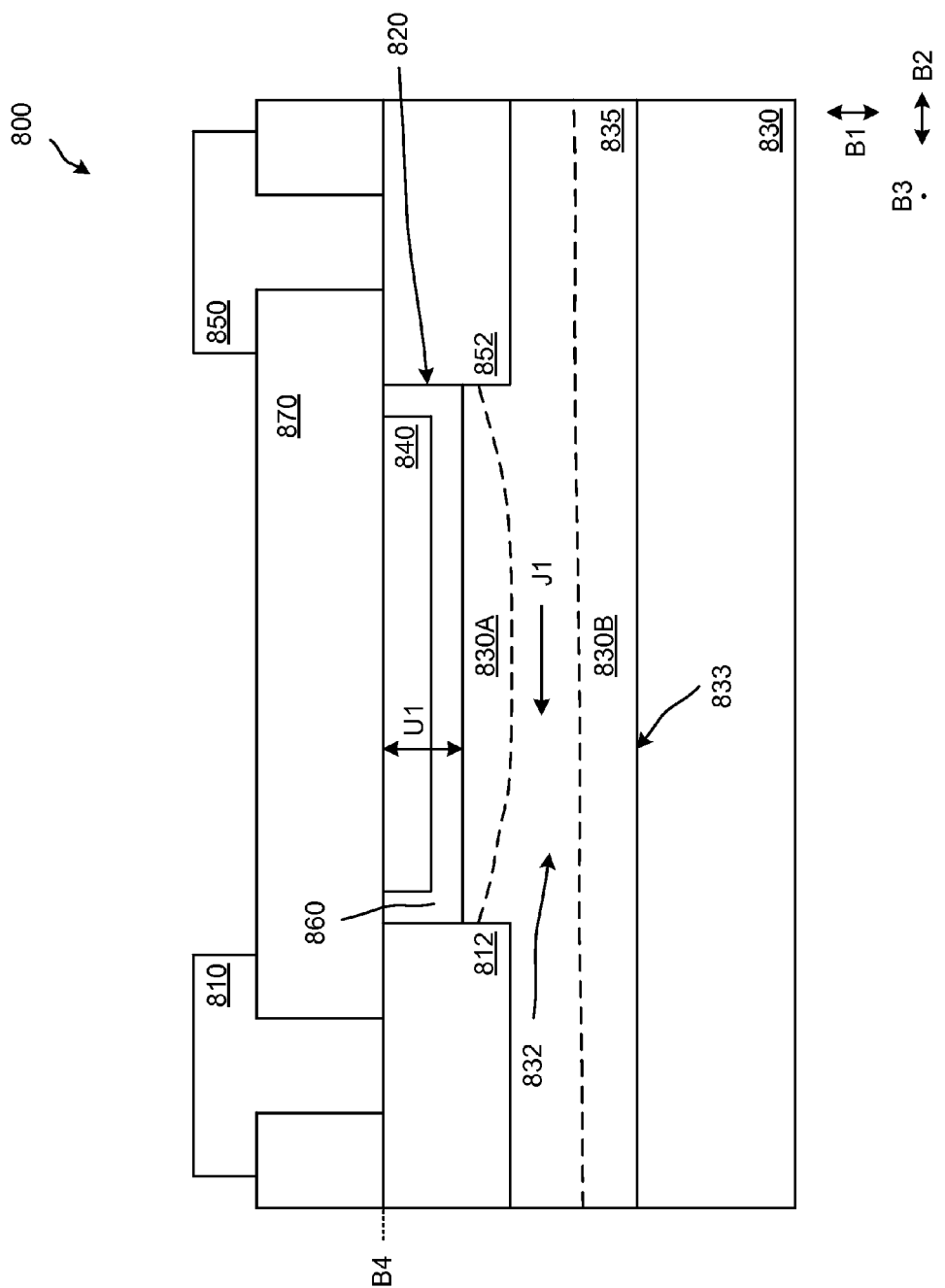
FIG. 8 is a diagram that illustrates a current limiter having a lateral configuration, according to an implementation.

FIG. 8 is a diagram that illustrates a current limiter 800 having a lateral configuration, according to an implementation. The characteristics and operation of the current limiter 800 can be similar to, or the same as, the operation of the current limiter 100 described in connection with, for example, FIGS. 1A through 2C. Accordingly, the operation and details of many of the features of the current limiter 800 such as dielectric features, gate to source connection features, and/or so forth will not be described in connection with FIG. 8. The current limiter 800 shown in FIG. 8 can be used, for example, relatively low saturation current applications.

As shown in FIG. 8, the current limiter 800 includes an epitaxial layer 835 disposed on a substrate 830. A trench 820 is disposed in the epitaxial layer 835, and an electrode 840 is disposed within the trench 820. A source implant 812 is disposed on a first side of the trench 820, and a drain implant 852 is disposed on a second side of the trench 820. A first portion of the electrode 840 is insulated from the source implant 812 by a first portion of the dielectric 860, and a second portion of the electrode 840 is insulated from the drain implant 852 by a second portion of the dielectric 860. Electrode 840 is also insulated from the epitaxial layer 835 by at least a portion of the dielectric 860.

As shown in FIG. 8, the source implant 812 and the drain implant 852 are respectively coupled to (e.g., electrically coupled to) a source conductor 810 and a drain conductor 850. The source conductor 810 is coupled to the source implant 812 through a via in a dielectric layer 870. Similarly, the drain conductor 850 is coupled to the drain implant 852 through a via in the dielectric layer 870. In some implementations, the source implant 812/source conductor 810 can generally be referred to as a source, and the drain implant 852/drain conductor 850 can generally be referred to as a drain.

As shown in FIG. 8, a bottom surface of the source implant 812 and a bottom surface of the drain implant 852 have a depth in the epitaxial layer 835 deeper than a depth U1 of a bottom surface of the trench 820. Said conversely, the depth U1 of the bottom surface of the trench 820 can be shallower than a bottom surface of the source implant 812 and/or a bottom surface of the drain implant 852. Accordingly, the trench 820 can have a relatively shallow depth. The depth U1 of the trench 820, as shown in FIG. 8 is from a top surface of the epitaxial layer 835 (or mesa defined by the trench 820), which is aligned along plane B4. In some implementations, the bottom surface of the source implant 820 and/or a bottom surface of the drain implant 852 can have a depth in the epitaxial layer 835 that is the same as or less than the depth U1 of a bottom surface of the trench 820.

In this implementation, the source implant 812 is coupled to (e.g., electrically coupled to) the electrode 840. In some implementations, the source implant 812 can be coupled to the electrode 840 via the source conductor 810. Electrical connections between the electrode 840 and the source conductor 810 are not shown in FIG. 8. In some implementations, the electrode 840 can be biased to a potential independent of the source implant 812.

In this implementation, the space charge region 832 can be defined so that a current J1 can flow between the source implant 812 and the drain implant 852. The space charge region 832 is in a conducting state when a voltage drop between the source implant 812 and the drain implant 852 is approximately zero. In other words, the current limiter 800 (similar to the current limiter described above) can be biased to a conducting state.

As a difference in voltage between the source implant 812 and the drain implant 852 increases (e.g., when the drain potential is greater than the source potential), the space charge region 832 is pinched off by a combination of a depletion region 830A (illustrated by the dashed line) and a depletion region 830B (illustrated by dashed line). In other words, as a difference in voltage between the source implant 812 and the drain implant 852 increases (e.g., when the drain potential is greater than the source potential), the space charge region 832 is pinched off in the space charge region 832 between the depletion region 830A and the depletion region 830B.

In this implementation, the substrate 830 has a conductivity type different than a conductivity type of the epitaxial layer 835. In some implementations, the substrate 830 can have a P-type conductivity, and the epitaxial layer 835 can have an N-type conductivity, or vice versa. Accordingly, a PN junction can be defined at an interface 833 between the epitaxial layer 835 and the substrate 830. The depletion region 830B can be part of the PN junction associated with the PN junction. At least a portion of the depletion region 830B is formed in the space charge region 832 within the epitaxial layer 835. In some implementations, a voltage can be applied to the substrate 830 to modify the size (e.g., depth, thickness) of the depletion region 830B. This can result in a difference in the current limit of the current limiter 800.

When a difference in voltage between the source implant 812 and the drain implant 852 is applied, the depletion region 830A is increased in the space charge region 832 within the epitaxial layer 835. In some implementations, the depletion region 830A can be relatively small (or nonexistent) when a potential applied to the source implant 812 is approximately equal to a potential applied to the drain implant 852. In other words, the current limiter 800 can be configured so that the depletion region 830A is relatively small or non-existent when a difference in voltage between the source implant 812 (or source conductor 810) and the drain implant 852 (or drain conductor 850) is zero or close to zero. The current limiter 800 can be configured so that the depletion region 830A increases in size (or volume) as a difference in voltage between the source implant 812 (or source conductor 810) and the drain implant 852 (or drain conductor 850) increases from zero (or increase from close to zero).

Figure 9A:
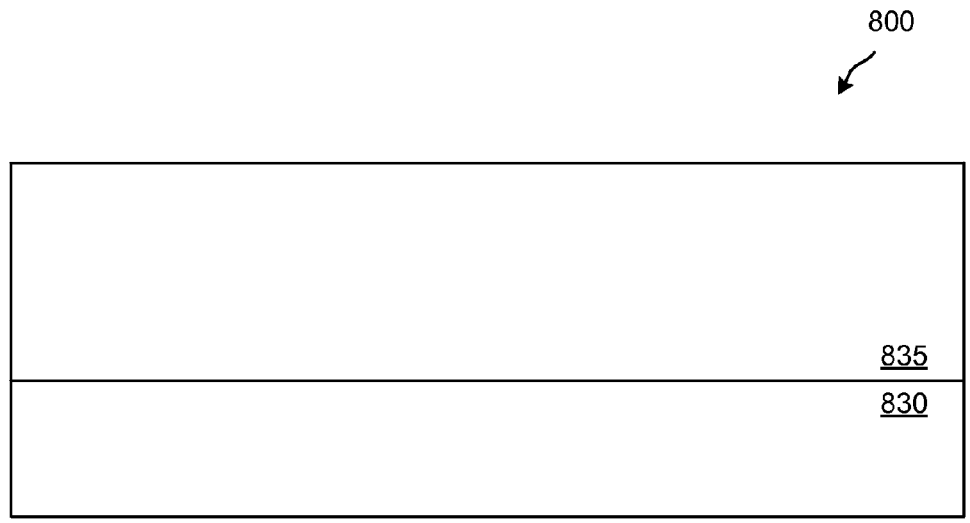
FIGS. 9A through 9E are diagrams that illustrate a method of making the current limiter shown in FIG. 8.

FIGS. 9A through 9E are diagrams that illustrate a method of making the current limiter 800 shown in FIG. 8. As shown in FIG. 9A, an epitaxial layer 835 is formed on a substrate 830. In some implementations, the substrate 830 can be a P-type substrate and the epitaxial layer 835 can be an N-type epitaxial layer.

Figure 9B:
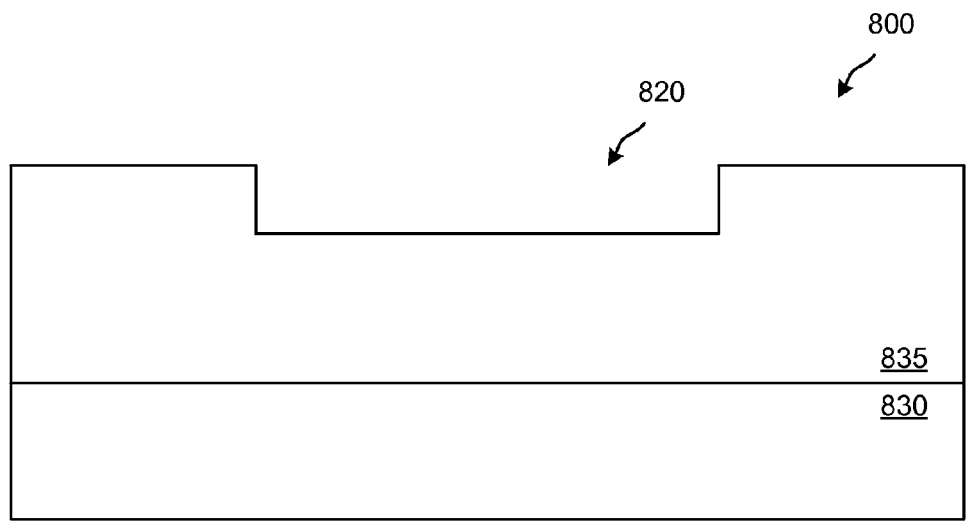

As shown in FIG. 9B, a trench 820 is formed in the epitaxial layer 835. In some implementations, the trench 820 can be a relatively shallow trench formed using a masking process, an etching process, and so forth.

Figure 9C:
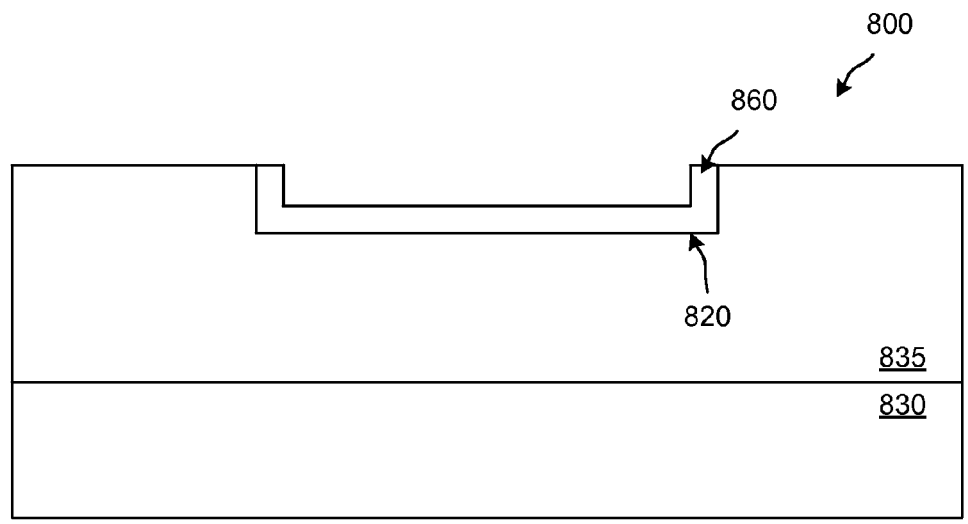

FIG. 9C illustrates a dielectric 860 formed in the trench 820. The dielectric 860 is formed on a sidewall and a bottom surface of the trench 820. In some implementations, the dielectric 860 can be at least one of a thermally grown oxide or a deposited oxide. In some implementations, the dielectric 860 can be doped with a dopant. In some implementations, the dielectric 860 can be formed from a conformally formed layer. The view shown in FIG. 9C can be after at least a portion of the dielectric 860 is removed from one or more surfaces outside of the trench 820 (e.g., a top surface of the epitaxial layer 835, a surface of mesa adjacent the trench 820), using a chemical and/or mechanical process.

Figure 9D:
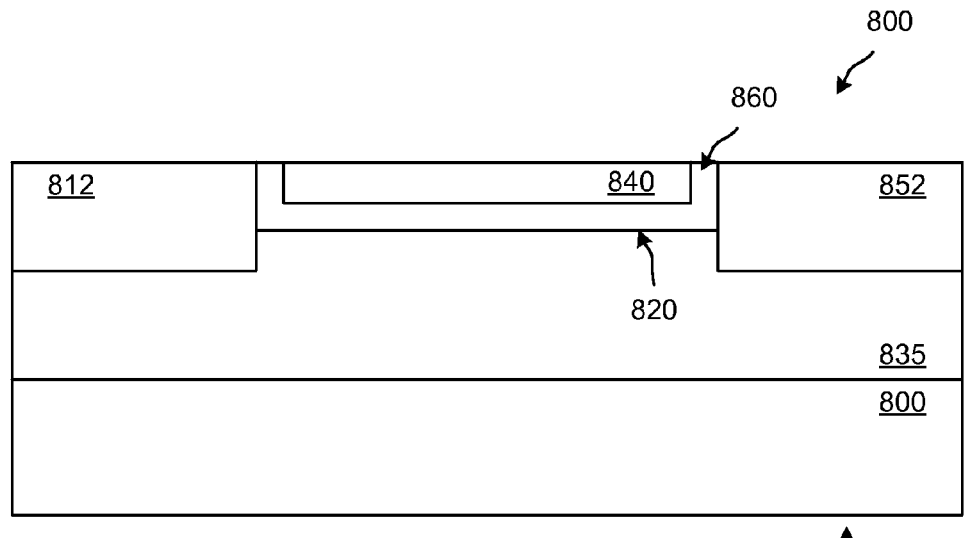

FIG. 9D is a diagram that illustrates an electrode 840 disposed in the trench 820. The electrode 840 is formed on a sidewall and a top surface of the dielectric 860. The electrode 840 can be formed using a conformally deposited conductive material such as a polysilicon (e.g., a doped polysilicon). The view shown in FIG. 9D can be after at least a portion of the electrode 840 is removed from one or more surfaces outside of the trench 820 (e.g., a top surface of the epitaxial layer 835, a surface of mesa adjacent the trench 820), using a chemical and/or mechanical process.

Although not shown in FIG. 9D, in some implementations, a portion of the electrode 840 can be removed so that the electrode 840 is recessed within the trench 820. In such implementations, the electrode 840 can have a top surface that is entirely recessed within the trench 820 so that the top surface of the electrode 840 is at a depth (e.g., a vertical depth) below the top surface of the epitaxial layer 835 (or mesa adjacent the trench 820).

Also, as shown in FIG. 9D, a source implant 812 and a drain implant 852 are formed within the epitaxial layer 835. In some implementations, the source implant 812 and/or the drain implant 852 can be formed using a mask used to form the trench 820 and/or using a mask used to form the electrode 840.

Figure 9E:
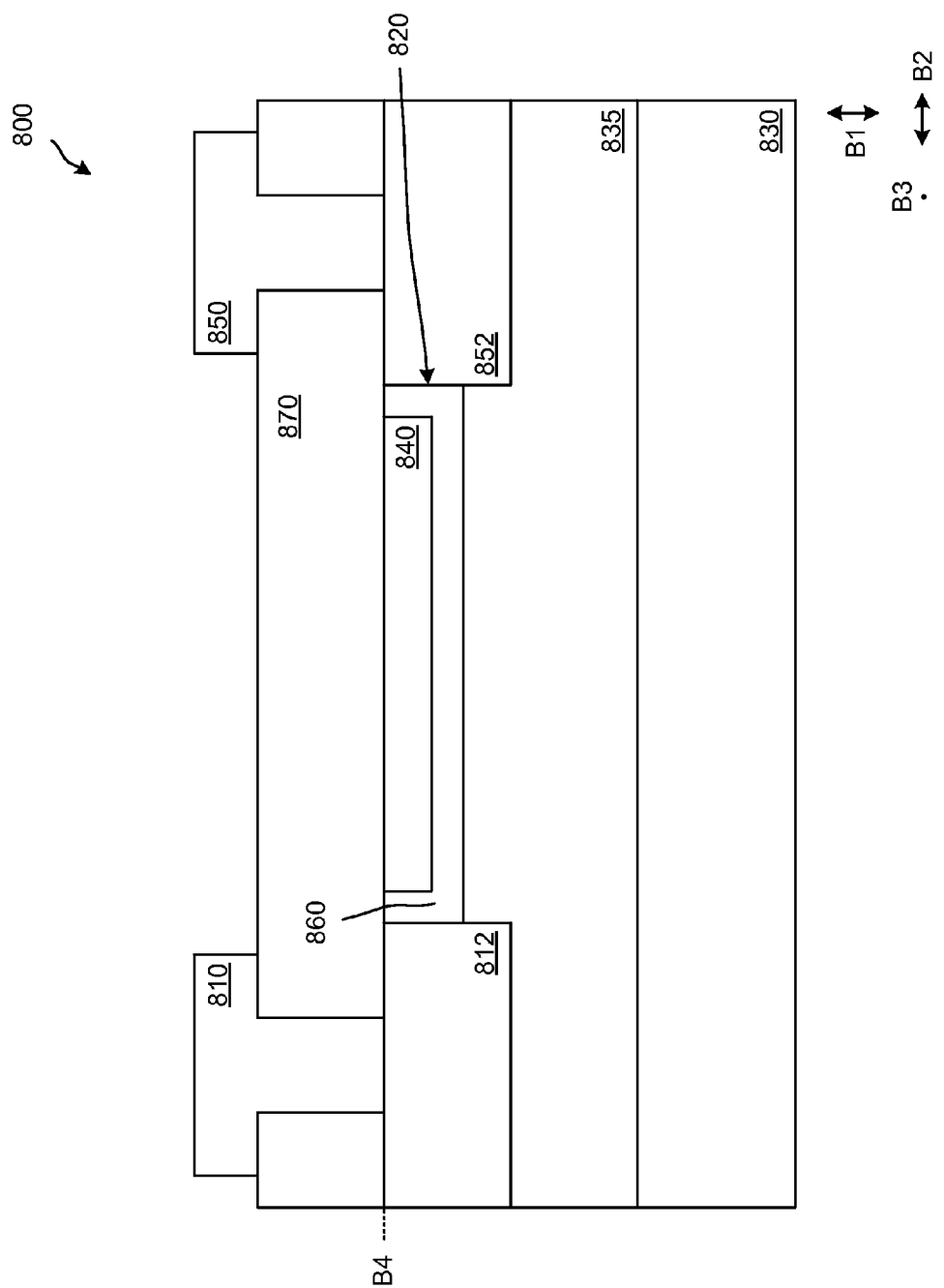

FIG. 9E illustrates formation of a dielectric layer 870, a source conductor 810, and a drain conductor 850. Vias can be formed within the dielectric layer 870 so that the source conductor 810 can be formed to contact the source implant 812, and so that the drain conductor 850 can be formed to contact the drain implant 852.

Referring to FIG. 8, the size (e.g., volume) of the depletion region 830A can be controlled by dopant type and dopant concentration of the electrode 840. If the electrode 840 is doped with an N-type dopant, increase dopant of the gate, then the depletion region 830A size decreases and the current region gets larger. If more P-type, then increase dopant of gate, then the depletion region 830A get larger and current region gets narrower.

If the electrode 840 is independently controlled from the source conductor 810 (such that the electrode 840 and the source conductor 810 are not shorted), a channel length (laterally from source implant 812 to the drain implant 852) can govern breakdown voltage. As the length of the channel is increased, the breakdown voltage is increased. In some implementations, the breakdown voltage can be a voltage at complete pinch-off (when the depletion region 830A is in contact with (or overlaps) the depletion region 830B. This can be induced by, for example, a negative differential voltage between electrode to source (where the electrode voltage is less than the source voltage).

In some implementations, an avalanche type breakdown (also can be referred to as avalanche breakdown) can occur when the current limiter 800 is in a saturation mode (e.g., operating in saturation region 14 shown in FIG. 2A). As with the breakdown voltage described above as a length of the channel (along direction B2) is increased, the avalanche breakdown is increased.

Although not shown in FIG. 8, the current limiter 800 can include multiple trenches. In other words, the structures illustrated in FIG. 8 can be duplicated (e.g., repeated) within the substrate epitaxial layer 835.

Figure 10:
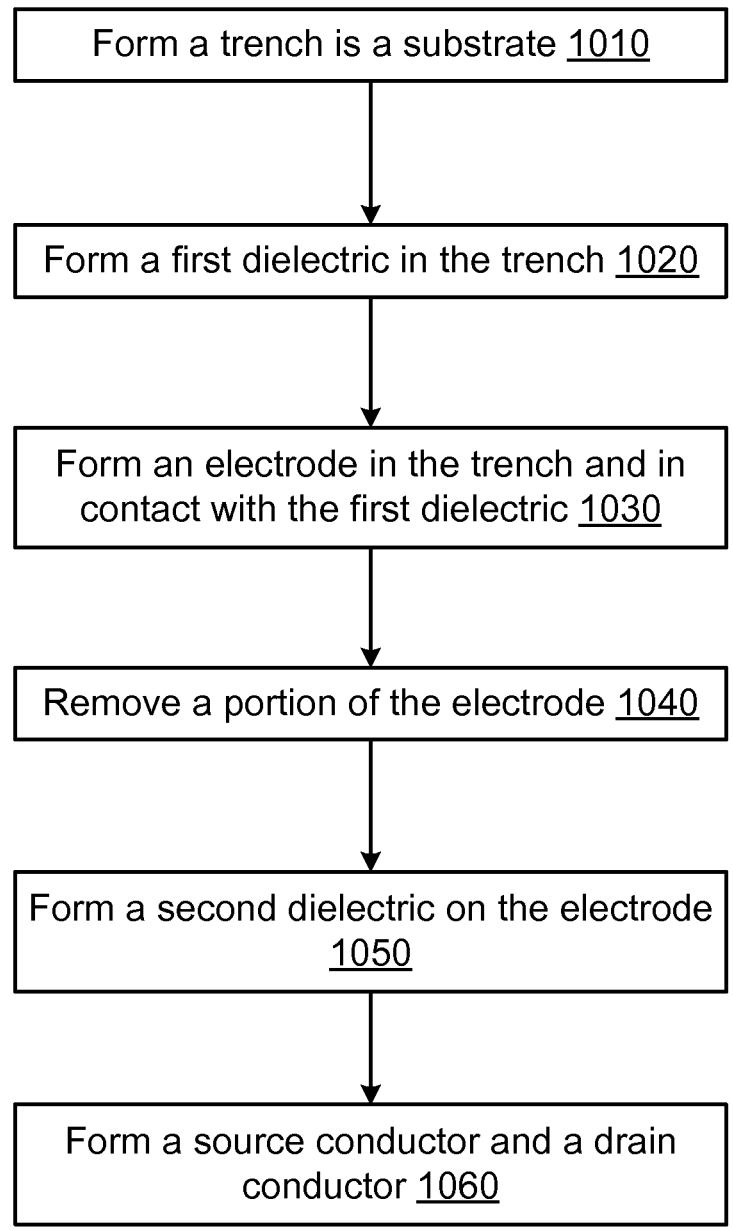
FIG. 10 is a flowchart that illustrates a method of making a current limiter, according to an implementation.

FIG. 10 is a flowchart that illustrates a method of making a current limiter, according to an implementation. The method can be used to make a current limiter such as the current limiters shown and described in connection with FIGS. 1A through 9E.

As shown in FIG. 10 a trench is formed in a substrate (block 1010). The trench can be formed in the substrate using, for example, a masking and etch process. One or more mesas (or mesa regions) can be defined when the trench is formed. The substrate can be, or can include, a semiconductor substrate made of, for example, Silicon (Si), Galium Arsenide (GaAs), Silicon Carbide (SiC), and/or so forth.

A first dielectric is formed in the trench (block 1020). In some implementations, the first dielectric can be referred to as a first dielectric layer. In some implementations, the first dielectric can be disposed on, or can line, one or more sidewalls of the trench and a bottom surface of the trench. In some implementations, at least a portion of the first dielectric can be etched from, for example, a top surface of a mesa defined by the trench. In some implementations, the first dielectric can be, or can include, an oxide. In some implementations, the first dielectric can be, or can include a thermally grown oxide and/or a deposited oxide. In some implementations, the first dielectric can be, or can include, a low-k dielectric.

An electrode is formed in the trench in contact with the first dielectric (block 1030). In some implementations, the electrode can be made of a conductive material. In some implementations, the electrode can be, or can include, a polysilicon. In some implementations, the electrode can be, or can include, a doped polysilicon. In some implementations, the electrode can be, or can include, a P-type doped polysilicon.

A portion of the electrode is removed (block 1040). In some implementations, the portion of the electrode can be removed so that the electrode is recessed within the trench. Accordingly, the electrode can be referred to as a recessed electrode. In other words, a top surface of the electrode, after the portion is removed, can be at a depth below a top surface of a mesa defined by the trench. Said differently, a top surface of the electrode can be below a top surface of the substrate.

In some implementations, processing can be performed so at least a portion of the electrode is disposed outside of the trench. In other words, a top surface of the electrode, can be at a vertical level above a top surface of a mesa defined by the trench. Said differently, a top surface of the electrode can be above a top surface of the substrate.

A second dielectric is formed on the electrode (block 1050). In some implementations, the second dielectric can be referred to as a second dielectric layer. In this implementation, a second dielectric is formed on the electrode. Specifically, the second dielectric can be formed on a top surface of the electrode (e.g., recessed electrode). In some implementations, the second dielectric can be doped with a dopant such as boron or phosphorus. In some implementations, the second dielectric can be doped with a dopant such that during processing, the second dielectric can flow into voids during, for example, an annealing process. In some implementations, multiple dielectrics (or dielectric layers) can be formed on the top surface of the electrode.

In some implementations, the second dielectric can be, or can include, an oxide. In some implementations, the second dielectric can be, or can include a thermally grown oxide and/or a deposited oxide. In some implementations, the second dielectric can be, or can include, a low-k dielectric.

A source conductor and a drain conductor are formed (block 1060). The source conductor and/or the drain conductor are made of a conductive material. In some implementations, the source conductor and/or the drain conductor can be, or can include, a doped polysilicon, a metal, and/or so forth. In some implementations, the electrode can be at least partially insulated from the source conductor via the second dielectric.

Although not shown in FIG. 10, in some implementations, the portion of the electrode may be removed (during block 1040) so that an extension can be formed through the second dielectric. The extension can couple (e.g., electrically couple) the source conductor to the electrode.

Although not shown in FIG. 10, in some implementations, a shield electrode can be formed within the trench. In such implementations, the shield electrode can be formed within the trench before the electrode is formed in the trench. Also, in such implementations, an inter-electrode dielectric can be formed between the shield electrode and the electrode.

In some implementations, the current limiter can be formed using the method described in FIG. 10 in a substrate monolithically with other semiconductor devices such as MOSFET devices, diode devices, resistor devices, insulated gate bipolar transistor (IGBT) devices, bipolar junction transistor (BJT) devices, and/or so forth. In some implementations, the current limiter can be electrically isolated from other semiconductor devices formed within the substrate. For example, in some implementations, the trench of the current limiter described in connection with FIG. 10 can be formed simultaneous with a trench of a vertical MOSFET device.

Figure 11A:
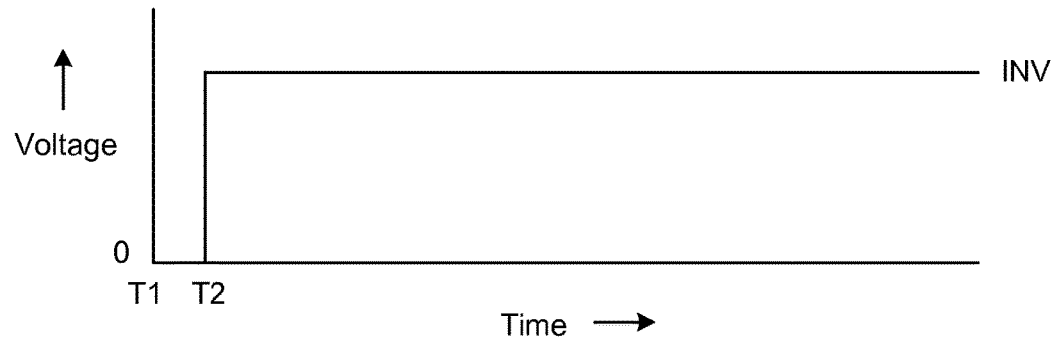
FIGS. 11A through 11C are diagrams that illustrate dynamic operation of a current limiter.
Figure 11B:
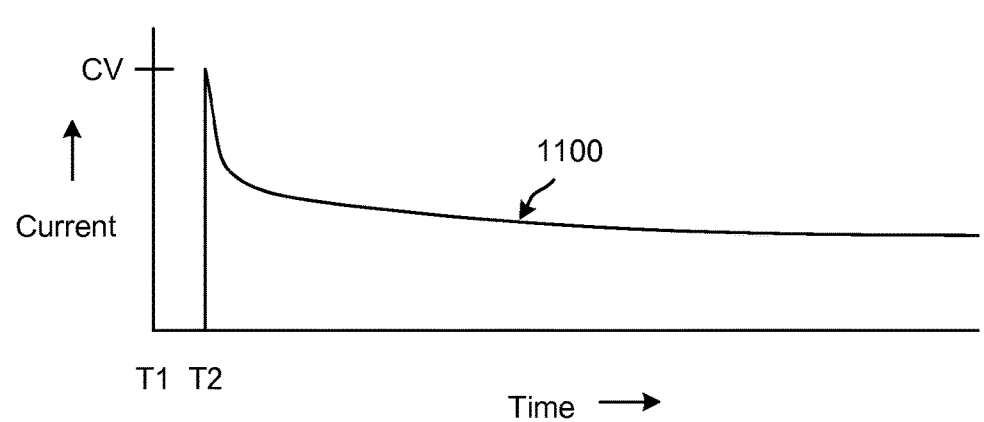
Figure 11C:
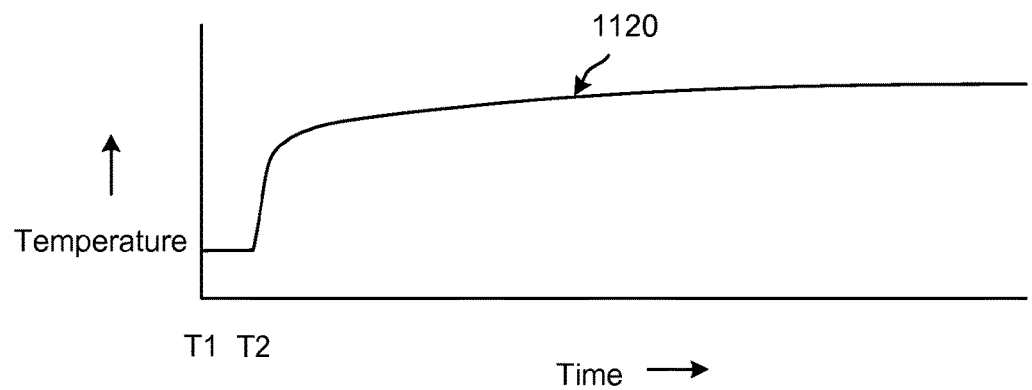

FIGS. 11A through 11C are diagrams that illustrate dynamic operation of a current limiter such as current limiter 100 shown in FIGS. 1A and 1B. Specifically, dynamic operation of the current limiter with an increase in operating temperature is shown in FIGS. 11A through 11C. A voltage difference across the current limiter versus time is shown in FIG. 11A, and a current through the current limiter versus time is shown in FIG. 11B. As shown in FIG. 11A, the voltage difference across the current limiter is approximately 0 at time T1. At time T2, the voltage difference across the current limiter is increased to INV. The corresponding current through the current limiter is shown in FIG. 11B.

As shown in FIG. 11B, the current through the current limiter is approximately zero at time T1 and is abruptly increased to current CV at time T2 (shown in curve 1100). As the current limiter heats in response to current flowing through current limiter, the current limit (e.g., saturation current limit) of the current limiter decreases thus causing a decrease in current through the current limiter as shown in FIG. 11B. The increase in temperature starting at time T2 from a steady state or ambient temperature (between time T1 and time T2) is shown in FIG. 11C (shown in curve 1200). Accordingly, the current limit (or saturation current limit) of the current limiter decreases with increasing temperature.

This behavior of the current limiter to have a decreasing current limit (or increasing resistance) with increasing temperature can enable controlled parallelization of current limiters. As mentioned above and as described in connection with FIG. 4, because the current limiter does not have a junction (e.g., is junction-less) and is configured as a normally-on device, the current limiting functionality of the current limiter 100 can have a decrease in current limit and increase in resistance with increases in temperature resulting in a thermally self-balanced device that can better support parallel device implementations.

The behavior of the current limiter shown in FIGS. 11A through 11C can be based on a combination of thermal self-balancing effects as well as e-field effects. In some implementations, the behavior of the current limiter shown in FIGS. 11A through 11C (or similar graphs) can be primarily driven by e-field effects as well rather than thermal effects. This is the case, in particular, if the time duration is relatively short (e.g., nano-second range) and when the current limiter is maintained at a constant temperature.

FIGS. 12A through 12C are diagrams that illustrate operation of multiple current limiters AL1, AL2, and AL3. FIG. 12A illustrates instantaneous resistance through the current limiters AL1, AL2, and AL3 versus voltage when voltage between the electrode (e.g., gate) and source is zero. The resistance can be between approximately 0 and 4 ohms and the voltage can be between approximately 0 and 40 volts.

FIG. 12B illustrates instantaneous resistance through the current limiters AL1, AL2, and AL3 versus current when voltage between the electrode (e.g., gate) and source is zero. The resistance can be between approximately 0 and 4 ohms and the current can be between approximately 0 and 15 amps. FIG. 12B has characteristics similar to FIG. 2C.

FIG. 12C illustrates current versus voltage characteristics of the current limiters AL1, AL2, and AL3 when voltage between the electrode (e.g., gate) and source is zero. The current can be between approximately 0 and 15 amps and the voltage can be between approximately 0 and 40 volts. As shown in FIG. 12C, the saturation current limit of the current limiters AL1, AL2, and AL3 is relatively constant (as illustrated by a dashed line CLL) until voltage VC1. At approximately voltage VC1 (which can be referred to as a saturation creep voltage), the saturation current limit increases. This increase in saturation current limit can be referred to as saturation current limit creep and this increase occurs at a relatively high voltage (e.g., at voltages (VGS) greater than 5V (e.g., 10V, 20V, 30V)) across the current limiters AL1, AL2, and AL3. The increase in the saturation current limit corresponds with decreases in resistance shown in FIG. 12A and 12B.

In some implementations, the saturation creep voltage (e.g., voltage VC1) can be modified by a bottom dielectric of a current limiter. For example, an increase in a thickness of the bottom dielectric (e.g., dielectric thickness D3 shown in current limiter 100 in FIG. 1A) can result in an increase in a saturation creep voltage. Conversely, a decrease in a thickness of the bottom dielectric can result in a decrease in the saturation creep voltage. Accordingly, a saturation creep voltage can be defined (e.g., governed) by a bottom dielectric thickness.

Figure 13:
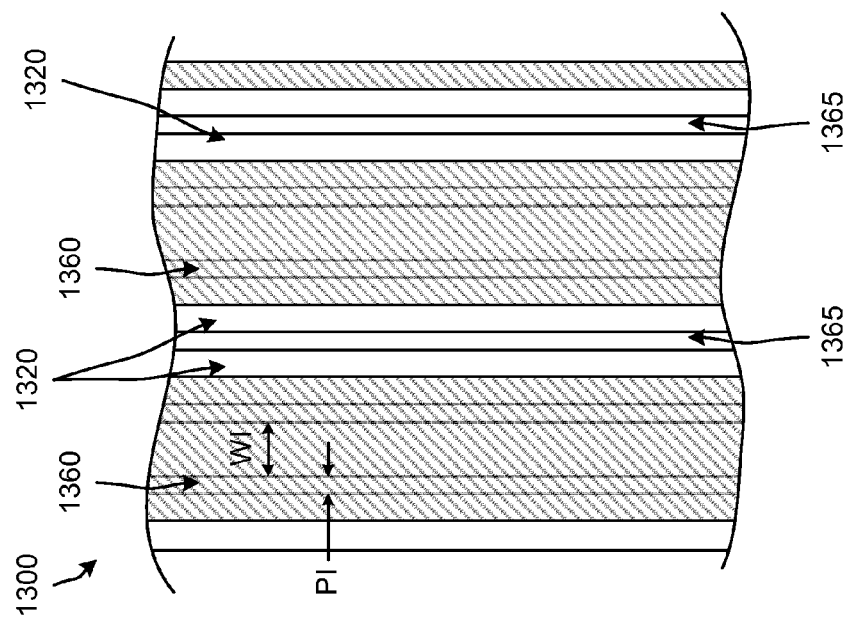

FIG. 13 is a diagram that illustrates a top view (e.g., a plan view) of trenches 1320 (which can include electrodes (not shown)) of a current limiter 1300. FIG. 13 illustrates trenches 1320 (aligned in parallel) and N+ blocking masks 1360 (or stripes) that will result in source implants (e.g., source regions) being excluded from the substrate (e.g., N-type substrate). Accordingly, source regions (not labeled) will be included in mesa regions 1365 between pairs of the trenches 1320. In the mesas 1365 without source regions, Schottky contacts may be formed (in contrast with other mesas where Ohmic contacts may be formed) with, for example, a metal. As a result, carrier injection via the Schottky contacts may be less than carrier injection via the Ohmic contacts and the Schottky contacted cells may not contribute as much to device current of the current limiter 1300. Accordingly, the active area of the current limiter 1300 can effectively be reduced and thereby suppress saturation current of the current limiter 1300.

Below is a table (Table II) that illustrates variations in the current limiter 1300 based on changes to pitch (PI) and width (WI) associated with a region being blocked by one or more of the blocking masks (e.g., blocking masks 1360). With a larger pitch PI of one or more of the mesas 1365, I-sat of the current limiter 1300 increases (e.g., because the mesas 1365 are not blocked effectively by the blocking masks). With a larger width WI of the trenches 1320, I-sat of the current limiter 1300 decreases (e.g., because the mesas 1365 may be blocked effectively by the blocking masks). By modifying pitch PI and/or width WI, characteristics such as I-sat, breakdown voltage (BV) and/or Rdson can be controlled. The principles shown in Table II can be applied to any of the embodiments described herein (e.g., FIG. 14, FIG. 15, FIG. 16, etc.)

TABLE II

| Parameter | I-sat | Rdson | Breakdown Voltage |
| --- | --- | --- | --- |
| Pitch Increases | Increases | Decreases Minimal | Decreases |
| Width Increases | Decreases | Increases Minimal | Increases |

Figure 14:
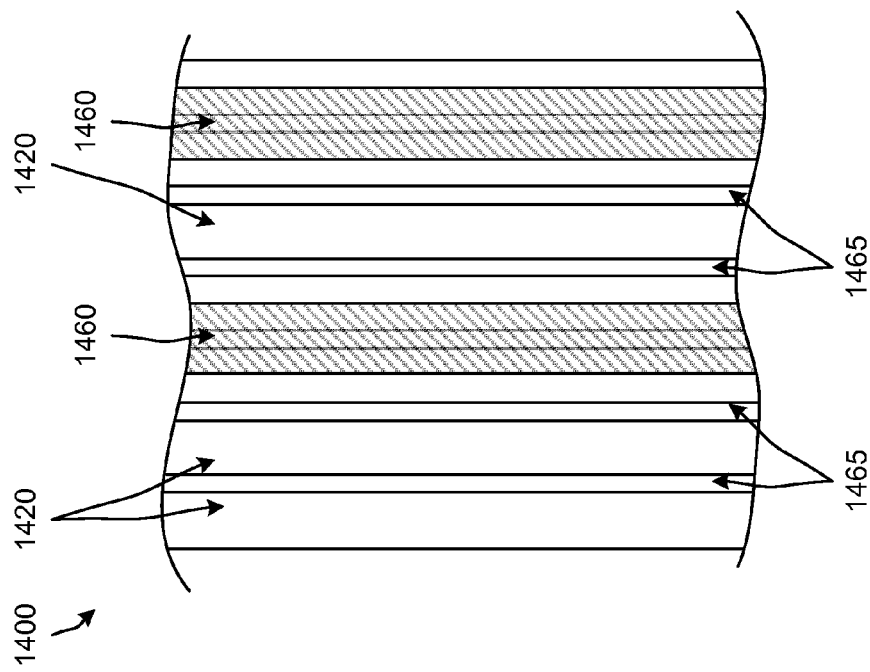
FIGS. 13 through 16 are diagrams that illustrate blocking masks associated with current limiters.

FIG. 14 is a diagram that illustrates a top view (e.g., a plan view) of trenches 1420 (which can include electrodes (not shown)) of a current limiter 1400. FIG. 14 illustrates trenches 1420 (aligned in parallel) and P+ blocking masks 1460. The P+ blocking masks 1460 result in P+ junctions (e.g., P+ regions) (by implantation) in the mesas 1465 (e.g., periodically in only a subset of mesas) to reduce the effective contact area. The substrate can be an N-type substrate in this case. In the areas with P+ regions, electron injection may not happen (or may be inhibited) which can result in a more desirable I-V characteristic (with breakdown voltage being increased) of the current limiter 1400. For example, the P+ junctions in the mesas 1465 utilize minority carrier flow to increase the overall breakdown voltage from drain to source (BV). In some implementations, periodic P+ junctions can cause the flow and collection of minority carriers (i.e. hole to the top electrode). This can prevent minority carrier trapping by the N+ region and/or this can also increase the breakdown voltage BV (saturation voltage creep point) of the current limiter 1420.

Figure 16:
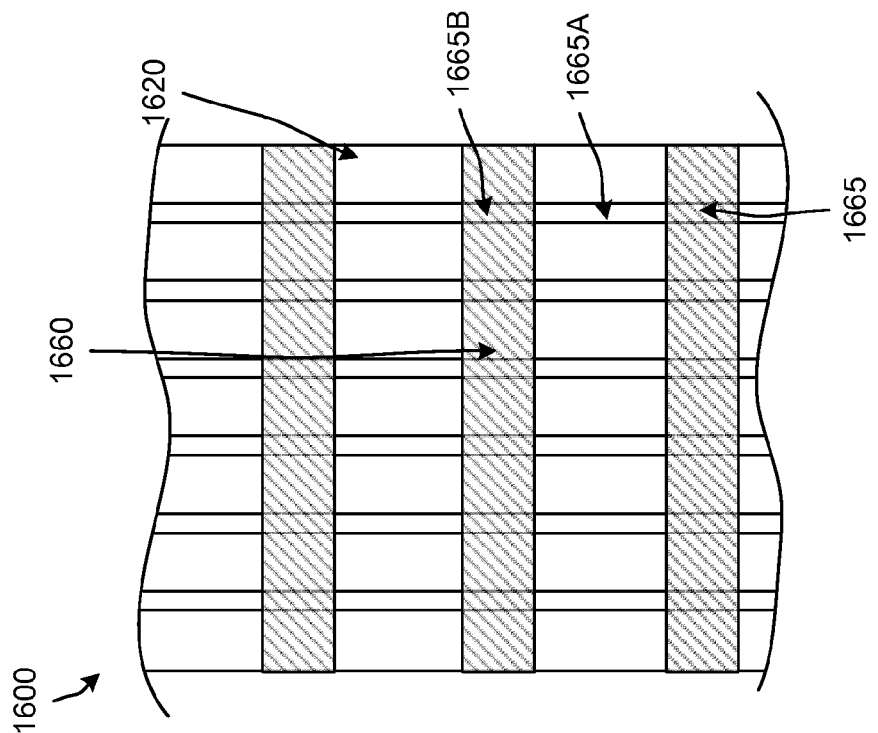
Figure 15:
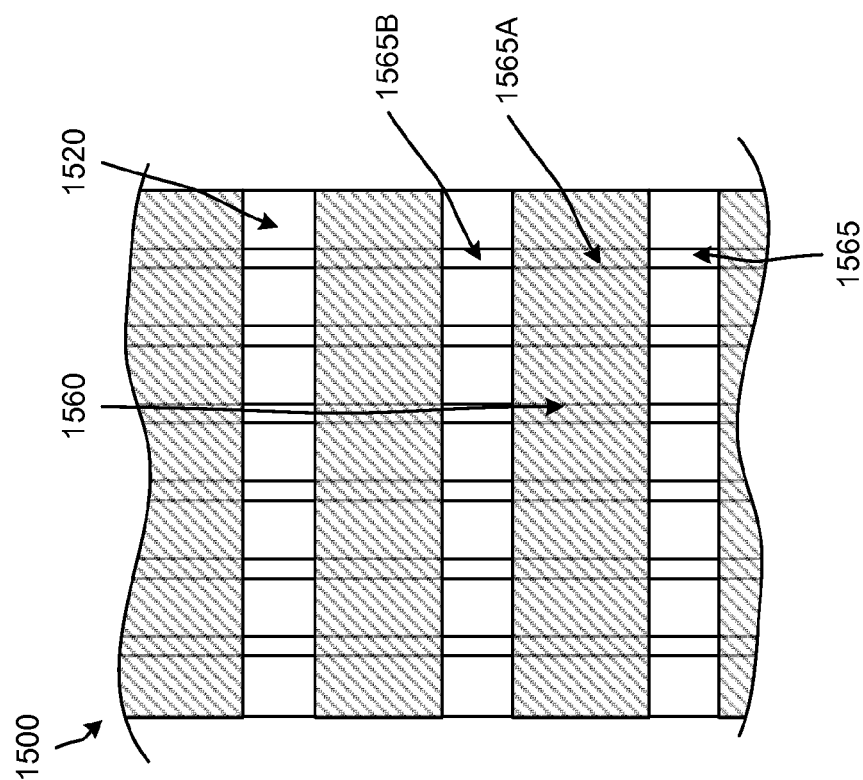
Figure 17B:
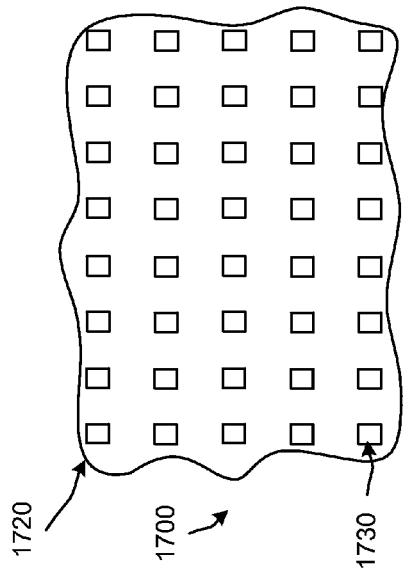
FIGS. 17A through 17D are diagrams that illustrate various configurations of current limiters.
Figure 17D:
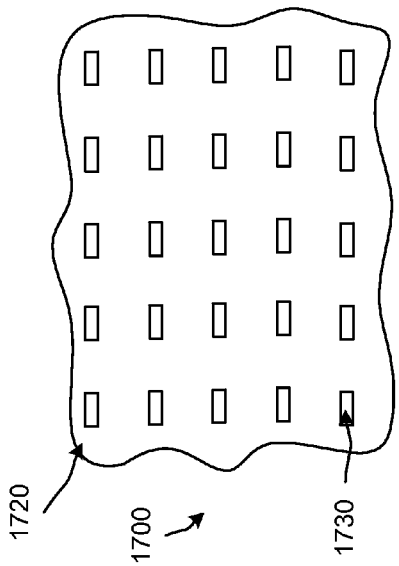
Figure 17A:
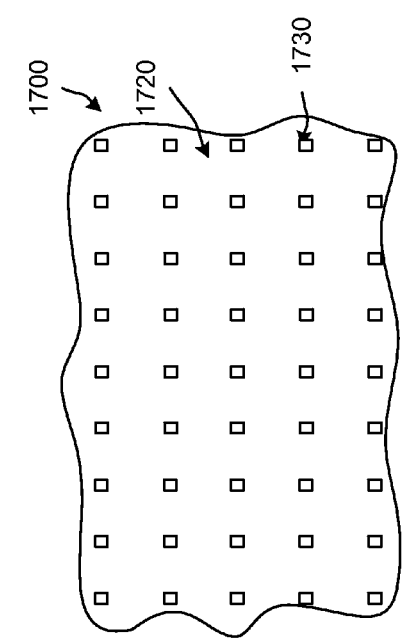
Figure 17C:
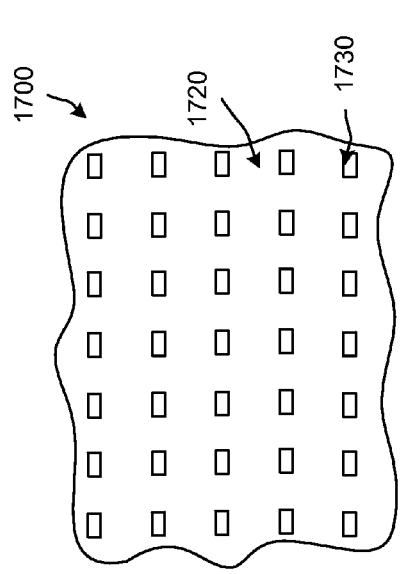

FIG. 15 is a diagram that illustrates a top view (e.g., a plan view) of a transverse blocking mask 1560 in a current limiter 1500. In this case, the blocking mask 1560 is an N+ blocking mask and is aligned perpendicular to the trench 1520 (which can include an electrode (not shown)). Accordingly, region 1565B of mesa 1565 is implanted with a N+ implant and region 1565A is blocked from the N+ implant. As shown in FIG. 16, the blocking mask 1560 has a width that is relatively wide compared with a width of the trench 1620.

FIG. 16 is a diagram that illustrates a top view (e.g., a plan view) of a transverse blocking mask 1660 in a current limiter 1600. In this case, the blocking mask 1660 is a P+ blocking mask and is aligned perpendicular to the trench 1620 (which can include an electrode (not shown)). Accordingly, region 1665B of mesa 1665 is implanted with a P+ implant and region 1665A is blocked from the P+ implant. As shown in FIG. 16, the blocking mask 1660 has a width that is relatively narrow (or the same as) compared with a width of the trench 1620. In some implementations, one or more of the current limiters 1300, 1400, 1500, 1600 can have an N-type substrate or a P-type substrate. In some implementations, one or more of the blocking masks 1360, 1460, 1560, or 1660 can be a P-type blocking mask or an N-type blocking mask.

In some implementations, one or more of the blocking masks can be defined so that some of the mesa (or portions thereof (e.g., a first portion)) include PN junctions, or regions with PN junctions, and some of the mesa (or portions thereof (e.g., a second portion)) are junctionless. For example, in some implementations, region 1565B of mesa 1565 can include a PN junction (vertically into the page from source to drain), and region 1565A can be junctionless (a same conductivity type vertically into the page from source to drain). The current flow through junctionless regions or portions can be different than the current flow through the junctioned regions or portions. In some implementations, current flow can be concentrated through a junctionless region (compared with a junctioned region).

FIGS. 17A through 17D are diagrams that illustrate top views (e.g., plan views) of various configurations of current limiters 1700. As shown in FIGS. 17A through 17D, the current limiters include trenched or recessed areas 1720 (which can include electrodes (not shown)) and mesas 1730 (or pillars). The mesas 1730 have a relatively small surface area with a variety of shapes including squares or rectangles. These layouts can effectively reduce the contact area and active area of the current limiters 1700, thereby suppressing the saturation current limit for a given unit cell design. At least some of the cell layouts or designs can be referred to as closed cell designs or layouts.

In some implementations, the mesas 1730 can have different shapes (or combinations of shapes) and/or dimensions than shown in FIGS. 17A through 17D including circular shapes, hexagonal shapes, shapes having different aspect ratios, and/or so forth. In some implementations, the ratio of the surface area (when viewed from above) of the mesas 1730 with respect to surface area the trenched areas 1720 can be different than shown in FIGS. 17A through 17D. In some implementations one or more blocking masks can be used to block implantations in the mesas 1730 and form a variety of regions in the mesas 1730 with a variety of conductivity types.

In some implementations, the conductivity types in FIGS. 13 through 17D can be changed or reversed. In some implementations, one or more of the features described in connection with any of FIGS. 13 through 17D can be combined into a single current limiter.

The current limiters described herein can be junction-less, normally-on devices that take advantage of field effect current saturation to limit current in response to a voltage difference. The current limiters, which can have a gate electrode electrically coupled to source, can be optimized for current limiting and can be configured to do so without a control circuit. The current limiters can be self-balancing in parallel configurations. The current limiters also can be relatively impervious to reverse current and can have a relatively low resistance reverse path.

In one general aspect, an apparatus can include a semiconductor substrate. The apparatus can include a trench defined within the semiconductor substrate and having a depth aligned along a vertical axis, a length aligned along a longitudinal axis, and a width aligned along a horizontal axis. The apparatus can include a dielectric disposed within the trench, and an electrode disposed within the dielectric and insulated from the semiconductor substrate by the dielectric. The semiconductor substrate can have a portion aligned vertically and adjacent the trench. The portion of the semiconductor substrate can have a conductivity type that is continuous along an entirety of the depth of the trench. The apparatus can be biased to a normally-on state.

In some implementations, the apparatus can include a source conductor disposed on a first side of the semiconductor substrate, and a drain conductor disposed on a second side of the semiconductor substrate opposite the first side of the semiconductor substrate.

In some implementations, the apparatus can include a source conductor disposed on a first side of the semiconductor substrate, and a drain conductor disposed on a second side of the semiconductor substrate opposite the first side of the semiconductor substrate. The portion of the semiconductor substrate can have the conductivity type extending between the source conductor and the drain conductor.

In some implementations, the apparatus can include a source conductor disposed on a top surface of the semiconductor substrate. The dielectric can have a portion disposed between the source conductor and the electrode. In some implementations, the apparatus can include a source conductor disposed on a top surface of the semiconductor substrate. The dielectric can have a portion coupled to the source conductor and coupled to the electrode.

In some implementations, the conductivity type is a P-type conductivity, and the electrode has an N-type conductivity. In some implementations, the apparatus is a junctionless device. In some implementations, the portion of the semiconductor substrate is a first portion of the semiconductor substrate. The apparatus can include a source conductor disposed on a first side of the semiconductor substrate and coupled to a first portion of the dielectric, and a drain conductor disposed on a second side of the semiconductor substrate opposite the first side of the semiconductor substrate. The drain conductor can be separated from a second portion of the dielectric by a second portion of the semiconductor substrate, and the electrode can be coupled to the source conductor.

In some implementations, the dielectric has a first portion aligned vertically and a second portion aligned horizontally. The apparatus can include a first space charge region in contact with the first portion, and a second space charge region in contact with the second portion. In some implementations, the apparatus is configured to limit current to a saturation current in response to voltage drop across the semiconductor substrate.

In another general aspect, a method can include removing a plurality of charges from a region in contact with an interface between a dielectric and a semiconductor substrate in response to a difference between a voltage applied to a source conductor and a voltage applied to a drain conductor increasing, and blocking at least a portion of a current between the source conductor and the drain conductor via the removing the plurality of charges from the region.

In some implementations, the region is a first region, the interface is a first interface, and the plurality of charges includes a first plurality of charges. The method can include removing a second plurality of charges from a second region in contact with a second interface between the dielectric and the semiconductor substrate, and the second interface can be substantially orthogonal to the first interface.

In some implementations, the voltage applied to the source conductor is substantially equal to a voltage applied to an electrode in contact with the dielectric. In some implementations, the voltage applied to the drain conductor is greater than the voltage applied to the source conductor. In some implementations, the method can include increasing a current within the region, the region has a resistance that increases in response to the increasing current.

In yet another general aspect, an apparatus can include a semiconductor substrate, and a trench defined within the semiconductor substrate and having a depth aligned along a vertical axis, a length aligned along a longitudinal axis, and a width aligned along a horizontal axis. The apparatus can include a dielectric disposed within the trench, and an electrode disposed within the dielectric and insulated from the semiconductor substrate by the dielectric. The semiconductor substrate can have a portion aligned vertically and adjacent the trench, the portion of the semiconductor substrate can have a conductivity type that is continuous along an entirety of the depth of the trench. The apparatus can be biased to an on-state.

In some implementations, the apparatus can include a source conductor disposed on a first side of the semiconductor substrate, and a drain conductor disposed on a second side of the semiconductor substrate opposite the first side of the semiconductor substrate.

Although the behavior of the circuits shown and described in the graphs herein as making transitions at specified voltages and at specified times, when implemented, the transitions of components may occur slightly before or slightly after the specified voltages, specified times, and/or so forth. Specifically, variations in threshold voltages, processing variations, temperature variations, switching speeds of devices, circuit transition delays, and/or so forth can result in conditions (e.g., non-ideal conditions) that can trigger transitions of components slightly before or slightly after the specified voltages, times, and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:
1. An apparatus, comprising:
a semiconductor substrate;
a trench defined within the semiconductor substrate and having a depth aligned along a vertical axis, a length aligned along a longitudinal axis, and a width aligned along a horizontal axis;
a dielectric disposed within the trench; and
an electrode disposed within the dielectric and insulated from the semiconductor substrate by the dielectric, the semiconductor substrate having a portion aligned vertically and adjacent the trench, the portion of the semiconductor substrate having a conductivity type that is continuous along an entirety of the depth of the trench, the apparatus being biased to a normally-on state.

2. The apparatus of claim 1, wherein the portion is a first portion of a mesa, the mesa has a second portion including a PN junction.

3. The apparatus of claim 1, further comprising:
a source conductor disposed on a first side of the semiconductor substrate; and
a drain conductor disposed on a second side of the semiconductor substrate opposite the first side of the semiconductor substrate.

4. The apparatus of claim 1, further comprising:
a source conductor disposed on a first side of the semiconductor substrate; and
a drain conductor disposed on a second side of the semiconductor substrate opposite the first side of the semiconductor substrate,
the portion of the semiconductor substrate having the conductivity type extending between the source conductor and the drain conductor.

5. The apparatus of claim 1, further comprising:
a source conductor disposed on a top surface of the semiconductor substrate, the dielectric having a portion disposed between the source conductor and the electrode.

6. The apparatus of claim 1, further comprising:
a source conductor disposed on a top surface of the semiconductor substrate, the dielectric having a portion coupled to the source conductor and coupled to the electrode.

7. The apparatus of claim 1, wherein the conductivity type is an N-type conductivity, the electrode has the N-type conductivity.

8. The apparatus of claim 1, wherein the apparatus is a junctionless device.

9. The apparatus of claim 1, wherein the portion of the semiconductor substrate is a first portion of the semiconductor substrate,
the apparatus further comprising:
a source conductor disposed on a first side of the semiconductor substrate and coupled to a first portion of the dielectric; and
a drain conductor disposed on a second side of the semiconductor substrate opposite the first side of the semiconductor substrate, the drain conductor being separated from a second portion of the dielectric by a second portion of the semiconductor substrate, the electrode being coupled to the source conductor.

10. The apparatus of claim 1, wherein the dielectric has a first portion aligned vertically and a second portion aligned horizontally,
the apparatus further comprising:
a first space charge region in contact with the first portion; and
a second space charge region in contact with the second portion.

11. The apparatus of claim 1, wherein the apparatus is configured to limit current to a saturation current in response to voltage drop across the semiconductor substrate.

12. The apparatus of claim 1, further comprising:
a source conductor having at least a portion disposed on a top surface of the semiconductor substrate and directly coupled to the electrode.

13. The apparatus of claim 1, further comprising:
a source conductor having at least a portion directly coupled to the electrode.

14. A method, comprising:
removing a plurality of charges from a region in contact with an interface between a dielectric and a semiconductor substrate in response to a difference between a voltage applied to a source conductor and a voltage applied to a drain conductor increasing; and
blocking at least a portion of a current between the source conductor and the drain conductor via the removing the plurality of charges from the region.

15. The method of claim 14, wherein the region is a first region, the interface is a first interface, the plurality of charges includes a first plurality of charges,
the method further comprising:
removing a second plurality of charges from a second region in contact with a second interface between the dielectric and the semiconductor substrate, the second interface being substantially orthogonal to the first interface.

16. The method of claim 14, wherein the voltage applied to the source conductor is substantially equal to a voltage applied to an electrode in contact with the dielectric.

17. The method of claim 14, wherein the voltage applied to the drain conductor is greater than the voltage applied to the source conductor.

18. The method of claim 14, further comprising:
increasing a current within the region, the region has a resistance that increases in response to the increasing current.

19. An apparatus, comprising:
a semiconductor substrate;
a trench defined within the semiconductor substrate and having a depth aligned along a vertical axis, a length aligned along a longitudinal axis, and a width aligned along a horizontal axis;
a dielectric disposed within the trench; and
an electrode disposed within the dielectric and insulated from the semiconductor substrate by the dielectric,
the semiconductor substrate having a portion aligned vertically and adjacent the trench, the portion of the semiconductor substrate having a conductivity type that is continuous along an entirety of the depth of the trench, the apparatus being biased to an on-state.

20. The apparatus of claim 19, further comprising:
a source conductor disposed on a first side of the semiconductor substrate; and
a drain conductor disposed on a second side of the semiconductor substrate opposite the first side of the semiconductor substrate.

* * * * *